United States Patent
Terakawa

(10) Patent No.: US 8,269,358 B2
(45) Date of Patent: Sep. 18, 2012

(54) BIS(AMINOPHENOL) DERIVATIVE, PROCESS FOR PRODUCING SAME, POLYAMIDE RESIN, POSITIVE PHOTOSENSITIVE RESIN COMPOSITION, PROTECTIVE FILM, INTERLAYER DIELECTRIC FILM, SEMICONDUCTOR DEVICE, AND DISPLAY ELEMENT

(75) Inventor: Koji Terakawa, Tokyo (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 613 days.

(21) Appl. No.: 12/446,751

(22) PCT Filed: Oct. 23, 2007

(86) PCT No.: PCT/JP2007/070978
§ 371 (c)(1),
(2), (4) Date: Oct. 16, 2009

(87) PCT Pub. No.: WO2008/050886
PCT Pub. Date: May 2, 2008

(65) Prior Publication Data
US 2010/0044888 A1    Feb. 25, 2010

(30) Foreign Application Priority Data

| Oct. 24, 2006 | (JP) | 2006-288191 |
| Oct. 26, 2006 | (JP) | 2006-290798 |
| Aug. 27, 2007 | (JP) | 2007-219344 |
| Aug. 27, 2007 | (JP) | 2007-219345 |

(51) Int. Cl.
*H01L 23/29* (2006.01)
*C07C 211/55* (2006.01)
*C08G 65/38* (2006.01)
*G03F 7/004* (2006.01)

(52) U.S. Cl. ............. 257/788; 257/E23.119; 428/1.1; 430/20; 430/270.1; 430/311; 430/319; 522/47; 522/62; 522/148; 522/164; 528/210

(58) Field of Classification Search .......... 430/189, 430/192, 270.1, 311, 319; 522/47, 62, 148, 522/164; 564/416, 418, 305, 330; 528/210; 428/1.1
See application file for complete search history.

(56) References Cited

U.S. PATENT DOCUMENTS

| 4,339,521 A | 7/1982 | Ahne et al. |
| 4,845,183 A | 7/1989 | Mueller et al. |
| 5,077,436 A * | 12/1991 | Yoshikawa et al. ........... 564/329 |
| 6,576,381 B1 * | 6/2003 | Hirano et al. .................. 430/11 |
| 7,238,455 B2 * | 7/2007 | Banba et al. ..................... 430/7 |
| 2010/0062273 A1 * | 3/2010 | Makabe et al. ............ 428/473.5 |
| 2010/0196808 A1 * | 8/2010 | Mizushima et al. ............ 430/18 |

FOREIGN PATENT DOCUMENTS

| CN | 1113273 C | 7/2003 |
| JP | 01-46862 B2 | 3/1981 |
| JP | 3078175 B2 | 11/1995 |
| JP | 2000-143804 A | 5/2000 |
| JP | 2000-281785 A | 10/2000 |
| JP | 2002-173532 A | 6/2002 |
| JP | 2003-073345 A | 3/2003 |
| JP | 2003-185857 A | 7/2003 |
| JP | 2003-252993 | 9/2003 |
| JP | 2005-241691 | 9/2005 |
| JP | 2006-162791 A | 6/2006 |
| JP | 2006-276094 A | 10/2006 |

OTHER PUBLICATIONS

Chinese Office Action for corresponding CN Application No. 200780042489.7, Oct. 12, 2010.
Extended European Search Report for the corresponding European patent application No. EP07830712.1, Jun. 14, 2010.

* cited by examiner

Primary Examiner — Susan W Berman
(74) Attorney, Agent, or Firm — Ditthavong Mori & Steiner, P.C.

(57) ABSTRACT

A bis(aminophenol) derivative having substituents at positions adjacent to two amino groups is provided. The bis(aminophenol) derivative is used as a raw material of a polyamide resin for a positive-tone photosensitive resin composition. A polyamide resin comprising bis(aminophenol) and a structure derived from a carboxylic acid is also provided, the bis(aminophenol) having substituents at positions adjacent to the two amino groups. A positive-tone photosensitive resin composition comprising a polybenzooxazole precursor resin, exhibiting high sensitivity and a high cyclization rate even when cured at a low temperature is provided. Also provided is a positive-tone photosensitive resin composition comprising a polyamide resin having an imide structure, an imide precursor structure, or an amide acid ester structure. The composition exhibits high sensitivity and produces a cured product having low water absorption even when cured at a low temperature.

27 Claims, No Drawings

BIS(AMINOPHENOL) DERIVATIVE, PROCESS FOR PRODUCING SAME, POLYAMIDE RESIN, POSITIVE PHOTOSENSITIVE RESIN COMPOSITION, PROTECTIVE FILM, INTERLAYER DIELECTRIC FILM, SEMICONDUCTOR DEVICE, AND DISPLAY ELEMENT

TECHNICAL FIELD

The present invention relates to a bis(aminophenol) derivative, a process for producing the same, a polyamide resin, a positive-type photosensitive resin composition, a protective film, an interlayer dielectric film, a semiconductor device, and a display element.

BACKGROUND ART

Aromatic diamines having two amino groups in one molecule have been used as a surface protection film or an interlayer dielectric film of semiconductor elements and as a raw material for polyamide resins having excellent heat resistance and outstanding electric and mechanical properties, and particularly as a raw material for a polyimide resin.

In recent years, due to an increase in demand for high-performance semiconductor elements, a resin having higher reliability is desired. A polybenzoxazole resin in which bis(aminophenol) is used as one of the raw materials has begun to be used in the latest semiconductor elements as a material having moisture-proof reliability due to non-possession of a carbonyl group derived from a high polar imide ring.

A part of a patterning process can be simplified by providing these resins with photosensitivity. A photosensitive resin composition having an effect of reducing the process time and increasing the yield is being developed by using these resins. More recently, a positive-type photosensitive resin composition which can be developed using an alkaline aqueous solution has been developed from the viewpoint of safety. For example, Patent Document 1 discloses a positive-type photosensitive resin composition which comprises a polybenzoxazole precursor having a structure derived from a bis(aminophenol) compound and dicarboxylic acid as a base resin and a diazoquinone compound as a sensitizer. The composition has high heat resistance, outstanding electrical properties, and fine patterning ability and has a possibility of being used not only as a wafer coating material, but also as a resin composition for interlayer insulation.

The development mechanism of the positive-type photosensitive resin composition is as follows. The diazoquinone compound in the unexposed area is insoluble in an alkaline aqueous solution. The base resin is provided with resistance to the alkaline aqueous solution as a result of an interaction with the diazoquinone compound. On the other hand, if exposed to light, the diazoquinone compound chemically changes and becomes soluble in an alkaline aqueous solution, and promotes dissolution of the base resin. A coated relief pattern consisting only of the resin composition in the unexposed area can be prepared by removing the exposed area by dissolution using the solubility difference of the exposed area and unexposed area patterning. The polybenzoxazole precursor resin in the positive-type photosensitive resin composition from which the coated relief pattern has been formed is cyclized by dehydration when cured at a temperature of about 300° C., whereby the precursor resin ultimately turns into a polybenzoxazole resin having high heat resistance. Remarkable miniaturization and high integration of semiconductor elements in recent years have reduced heat resistance, particularly of storage elements. In order to increase the yield of semiconductor elements, a polybenzoxazole precursor resin which can be cured at a lower temperature is demanded. The cyclization rate of the resin after curing is an important factor when curing the resin at a low temperature. A low cyclization rate not only lowers the moisture-proof reliability and chemical resistance due to an increase in the moisture absorption rate owing to the effect of alkali-soluble groups remaining in the resin, but also increases the dielectric constant.

In an effort to increase the cyclization rate, Patent Document 2, for example, discloses a polybenzoxazole precursor resin in which bis(aminophenol) containing an ether bond is used. The bis(aminophenol) containing an ether bond causes the molecular chains to move easily. Pattern formation using the polybenzoxazole precursor resin, however, is difficult because the polybenzoxazole precursor resin exhibits only very low transparency to ultraviolet radiation with a wavelength of 365 nm (i-line) which is very frequently used as an actinic rays in an exposure process.

When a positive-type photosensitive resin composition is used in practice, the sensitivity of the photosensitive resin composition is particularly important. Low sensitivity requires a long exposure time, which results in a low throughput. In order to increase the sensitivity of the photosensitive resin composition, a method of protecting the phenolic hydroxyl group in the polybenzoxazole precursor resin using an appropriate organic group may be conceivable. This method controls the intramolecular hydrogen bonding and increase transparency to i-line. However, the resulting resin composition is not sufficiently dissolved in an alkaline aqueous solution since the phenolic hydroxyl group which is an alkali soluble group is protected. Not only is the sensitivity lowered, but also the resin can be cyclized only with difficulty because of the increased distance between the phenolic hydroxyl group and the carbonyl carbon of the amide group.

Therefore, development of a positive-type photosensitive resin composition using a polybenzoxazole precursor resin exhibiting high sensitivity and a high cyclization rate even if cured at a low temperature, that is, a resin composition which satisfies both processability and reliability when cured at a low temperature is strongly desired. That is to say, it has been difficult for a general positive-type photosensitive resin composition to satisfy both high sensitivity and high cyclization rate when cured at a low temperature by using a polybenzoxazole precursor resin.

[Patent Document 1] Japanese Patent Publication No. 1-46862

[Patent Document 2] Japanese Patent No. 3078175

As the resin used for a positive-type photosensitive resin composition, in addition to the polybenzoxazole precursor resin having a benzoxazole precursor structure, a polybenzoxazole resin having a benzoxazole structure, a polyimide precursor resin having an imide precursor structure, a polyimide precursor resin having an amide acid ester structure, and a polyimide resin having an imide structure can be given. The polyimide precursor resins easily dissolve unexposed parts. Not only is it difficult for the polyimide precursor resins to produce a coated relief pattern, but it is also difficult to increase transparency to i-line in spite of the properties as a protecting film and an interlayer dielectric film for semiconductor elements and display elements. The polyimide precursor resins thus have a drawback of low sensitivity. Another problem with the polyimide precursor resins is high water absorption of a cured film, which leads to impairing reliability. Furthermore, the polyimide resin has a problem of reducing sensitivity when the imide ring absorbs actinic rays. In addition, there is the same problem of high water absorption of a cured film and poor reliability as in the polyimide precursor resin.

The present invention has been achieved in view of this situation and has an object of providing a positive-type photosensitive resin composition containing a polyamide resin having a benzoxazole precursor structure, particularly a polyamide resin containing the benzoxazole precursor structure as a major component, exhibiting high sensitivity and a high cyclization rate even when cured at a low temperature, and also a polyamide resin used as a raw material of the positive-type photosensitive resin composition. Another object of the present invention is to provide a positive-type photosensitive resin composition containing a polyamide resin having a benzoxazole structure, particularly a polyamide resin containing the benzoxazole structure as a major component, exhibiting high sensitivity and a high cyclization rate even when cured at a low temperature, and also a polyamide resin used as a raw material of the positive-type photosensitive resin composition. Still another object of the present invention is to provide a positive-type photosensitive resin composition containing a polyamide resin having an imide structure, an imide precursor structure, or an amide acid ester structure, exhibiting high sensitivity and a low moisture absorption rate even when cured at a low temperature, and also a polyamide resin used as a raw material of the positive-type photosensitive resin composition. A further object of the present invention is to provide a bis(aminophenol) derivative used as a raw material for the polyamide resins. A still further object of the present invention is to provide a protective film and an interlayer dielectric film produced from the positive-type photosensitive resin composition and a semiconductor element and a display element in which the protective film and the interlayer dielectric film are used.

DISCLOSURE OF THE INVENTION

The above objects can be attained by the following inventions.

1. A bis(aminophenol) derivative used as a raw material for a polyamide resin for a positive-type photosensitive resin composition, the bis(aminophenol) derivative having substituents at positions adjacent to two amino groups.
2. The bis(aminophenol) derivative according to claim 1, the bis(aminophenol) derivative being shown by the following formula (1),

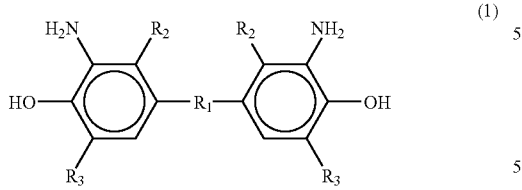

wherein $R_1$ is an organic group selected from the group consisting of an alkylene group, a substituted alkylene group, —O—, —S—, —SO$_2$—, —CO—, —NHCO—, or a single bond, $R_2$ individually represents an alkyl group, an alkoxy group, an acyloxy group, or a cycloalkyl group, and $R_3$ individually represents a hydrogen atom, an alkyl group, an alkoxy group, an acyloxy group, or a cycloalkyl group.
3. The bis(aminophenol) derivative according to claim 2, wherein $R_2$ in the formula (1) is an alkyl group and $R_3$ in the formula (1) is an alkyl group.

4. The bis(aminophenol) derivative according to claim 2 or 3, wherein $R_1$ in the formula (1) is an alkylene group or a substituted alkylene group.
5. A process for producing a bis(aminophenol) derivative used as a raw material for a polyamide resin for a positive-type photosensitive resin composition comprising a step of reducing a nitro group of a compound shown by the following formula (2),

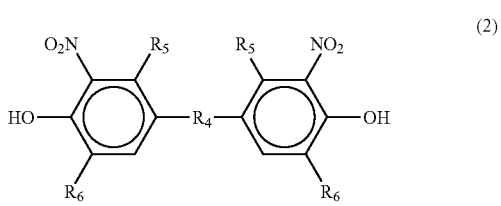

wherein $R_4$ is an organic group selected from the group consisting of an alkylene group, a substituted alkylene group, —O—, —S—, —SO$_2$—, —CO—, and —NHCO—, or a single bond, $R_5$ individually represents an alkyl group, an alkoxy group, an acyloxy group, or a cycloalkyl group, and $R_6$ individually represents a hydrogen atom, an alkyl group, an alkoxy group, an acyloxy group, or a cycloalkyl group.
6. The process for producing a bis(aminophenol) derivative according to claim 5, wherein the reduction of the nitro group is carried out in a hydrogen atmosphere in the presence of a transition metal catalyst.
7. A polyamide resin comprising bis(aminophenol) and a structure derived from a carboxylic acid, the bis(aminophenol) being a bis(aminophenol) derivative having substituents at positions adjacent to two amino groups.
8. A polyamide resin obtained by a reaction of a diamine component and a carboxylic acid component, all or a part of the diamine component being a bis(aminophenol) derivative having substituents at positions adjacent to two amino groups.
9. The polyamide resin according to claim 7 or 8, wherein the bis(aminophenol) derivative is a compound shown by the following formula (1),

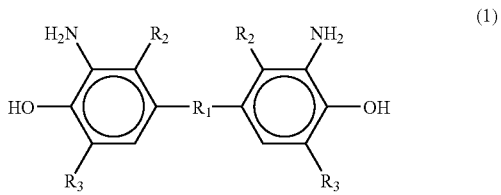

wherein $R_1$ is an organic group selected from the group consisting of an alkylene group, a substituted alkylene group, —O—, —S—, —SO$_2$—, —CO—, and —NHCO—, or a single bond, $R_2$ individually represents an alkyl group, an alkoxy group, an acyloxy group or a cycloalkyl group, and $R_3$ individually represents a hydrogen atom, an alkyl group, an alkoxy group, an acyloxy group, or a cycloalkyl group.
10. The polyamide resin according to claim 9, wherein $R_2$ in the bis(aminophenol) derivative shown by the formula (1) is an alkyl group or an alkoxy group and $R_3$ is an alkyl group or an alkoxy group.
11. The polyamide resin according to any one of claims 7 to 10, wherein the polyamide resin contains a polybenzoxazole precursor structure.

12. A positive-type photosensitive resin composition comprising (A) the polyamide resin according to any one of claims 7 to 11 and (B) a photosensitive diazoquinone compound.

13. The positive-type photosensitive resin composition according to claim 12, wherein the content of the photosensitive diazoquinone compound (B) is 1 to 50 parts by weight per 100 parts by weight of the polyamide resin (A) according to any one of claims 7 to 11.

14. The positive-type photosensitive resin composition according to claim 12 or 13, further comprising (C) a phenol compound.

15. The positive-type photosensitive resin composition according to claim 14, wherein the content of the phenol compound (C) is 1 to 30 parts by weight per 100 parts by weight of the polyamide resin (A) according to any one of claims 7 to 11.

16. A protective film consisting of a cured product of the positive-type photosensitive resin composition according to any one of claims 12 to 15.

17. An interlayer dielectric film consisting of a cured product of the positive-type photosensitive resin composition according to any one of claims 12 to 15.

18. The protective film according to claim 16 for protecting the surface of a semiconductor element or a display element.

19. A semiconductor device having the protective film according to claim 16.

20. A display element having the protective film according to claim 16.

21. A semiconductor device having the interlayer dielectric film according to claim 17.

22. A display element having the interlayer dielectric film according to claim 17.

According to the present invention, a positive-type photosensitive resin composition containing a polyamide resin having a benzoxazole precursor structure, particularly a polyamide resin containing a benzoxazole precursor structure as a major component, exhibiting high sensitivity and a high cyclization rate even when cured at a low temperature, as well as a polyamide resin used as a raw material of the positive-type photosensitive resin composition, can be provided. In addition, according to the present invention, a positive-type photosensitive resin composition containing a polyamide resin having a benzoxazole structure, particularly a polyamide resin containing the benzoxazole structure as a major component, exhibiting high sensitivity and a high cyclization rate even when cured at a low temperature, as well as a polyamide resin used as a raw material of the positive-type photosensitive resin composition, can be provided. According to the present invention, a positive-type photosensitive resin composition containing a polyamide resin having an imide structure, an imide precursor structure, or an amide acid ester structure, exhibiting high sensitivity and a low moisture absorption rate even when cured at a low temperature, and also a polyamide resin used as a raw material of the positive-type photosensitive resin composition, can also be provided. Furthermore, a bis(aminophenol) derivative used as a raw material for the polyamide resins can be provided according to the present invention. A protective film and an interlayer dielectric film produced from the positive-type photosensitive resin composition, as well as a semiconductor device and a display element in which the protective film and the interlayer dielectric film are used, can be provided by the present invention.

BEST MODE FOR CARRYING OUT THE INVENTION

The bis(aminophenol) derivative of the present invention is used as a diamine raw material for a polyamide resin. This is a compound having two aminophenol groups in one molecule, with substituents at positions adjacent to the two amino groups.

A polyamide resin in the present invention refers to a resin in which the main chain bonds by an amide bond, an imide bond, or a benzoxazole structure or by a combination of two or more of these. The polyamide resin has a benzoxazole precursor structure, a benzoxazole structure, an imide structure, an imide precursor structure, or an amide acid ester structure or a combination of two or more of these.

Therefore, the polyamide resin includes (i) a polyamide resin having a benzoxazole precursor structure or a polybenzoxazole precursor resin having a benzoxazole precursor structure as a major component, (ii) a polyamide resin having a benzoxazole structure or a polybenzoxazole resin having a benzoxazole structure as a major component, (iii) a polyamide resin having both a benzoxazole precursor structure and a benzoxazole structure, that is, a polyamide resin in which a part of the benzoxazole precursor structure in the polyamide resin (i) is cyclized into a benzoxazole structure, (iv) a polyamide resin having an imide precursor structure or a polyimide precursor resin having an imide precursor structure as a major component, (v) a polyamide resin having an imide structure or a polyimide resin having an imide structure as a major component, (vi) a polyamide resin having both an imide precursor structure and an imide structure, that is, a polyamide resin in which a part of the imide precursor structure in the polyamide resin (iv) is cyclized into an imide structure, (vii) a polyamide resin having both a benzoxazole precursor structure or a benzoxazole structure and an imide precursor structure or an imide structure, and (viii) a resin having a benzoxazole precursor structure, a benzoxazole structure, an imide structure, an imide precursor structure, or an amide acid ester structure or a combination of two or more of these.

The benzoxazole precursor structure, benzoxazole structure, imide structure, imide precursor structure, and amide acid ester structure in the present invention are respectively shown by the following formulas.

Benzoxazole Precursor Structure:

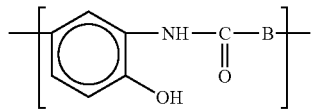

Benzoxazole Structure:

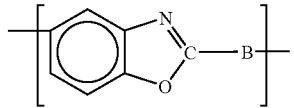

Imide Structure:

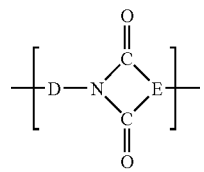

Imide Precursor Structure:

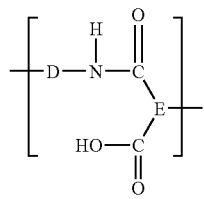

Amide Acid Ester Structure:

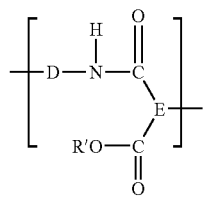

When the diamine component is bis(aminophenol) in the above structures, the imide structure, the imide precursor structure, and the amide acid ester structure are shown by the following formulas.

Imide Structure when the Diamine Component is Bis(aminophenol):

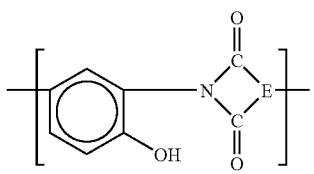

Imide Precursor Structure when the Diamine Component is Bis(aminophenol):

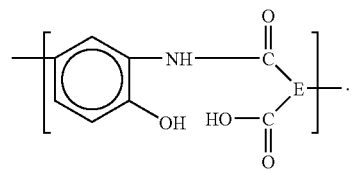

Amide Acid Ester Structure when the Diamine Component is Bis(aminophenol):

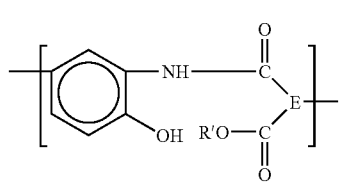

When the diamine component is a bis(aminophenol) derivative of the present invention in the above structures, the benzoxazole precursor structure, the benzoxazole structure, the imide structure, the imide precursor structure, and the amide acid ester structure are respectively shown by the following formulas.

Benzoxazole Precursor Structure when the Diamine Component is a Bis(aminophenol) Derivative of the Present Invention:

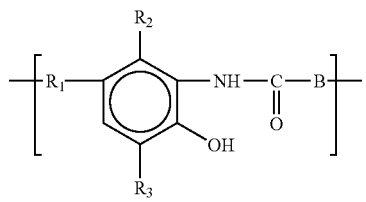

Benzoxazole Structure when the Diamine Component is a Bis(aminophenol) Derivative of the Present Invention:

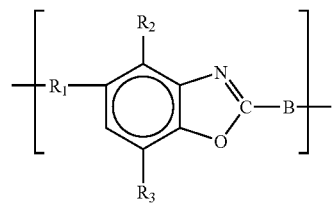

Imide Structure when the Diamine Component is a Bis(aminophenol) Derivative of the Present Invention:

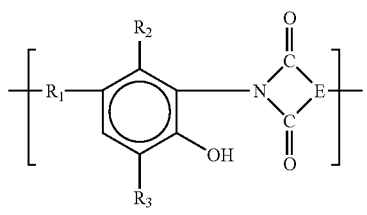

Imide Precursor Structure when the Diamine Component is a Bis(aminophenol) Derivative of the Present Invention:

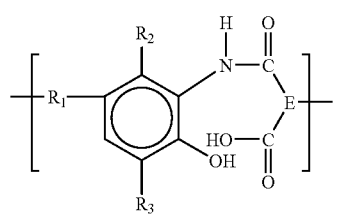

Amide Acid Ester Structure when the Diamine Component is a Bis(aminophenol) Derivative of the Present Invention:

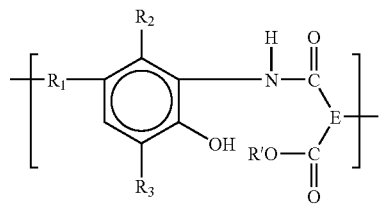

In the formulas, $R_1$, $R_2$, and $R_3$ are the same as the $R_1$, $R_2$, and $R_3$ in the formula (1), B, D, and E are organic groups, and R' represents an organic group having 1 to 15 carbon atoms.

In the bis(aminophenol) derivative of the present invention, when the position of the hydroxyl group on the aromatic ring in one of the two aminophenol groups is assumed to be the position 1, this aminophenol group has a hydroxyl group on the position 1, an amino group on the position 2 adjacent to the hydroxyl group, and a substituent on the position 3 adjacent to the amino group. Similarly, when the position of the hydroxyl group on the aromatic ring in the other aminophenol group is assumed to be position 1', this aminophenol group has a hydroxyl group on the position 1', an amino group on the position 2' adjacent to the hydroxyl group, and a substituent on the position 3' adjacent to the amino group.

The bis(aminophenol) derivative of the present invention can be obtained, for example, from a bis(nitrophenol) derivative by reducing both of the two nitro groups on the bis (nitrophenol) derivative using a transition metal catalyst in a hydrogen atmosphere.

The bis(aminophenol) derivative of the present invention and the process for producing the same will be described in detail below. The following embodiments are shown as examples and are not intended to limit the present invention.

Remarkable miniaturization and high integration of semiconductor elements in recent years have reduced heat resistance, particularly of storage elements. In order to increase the yield, a polybenzoxazole precursor resin which can be cured at a lower temperature is demanded. On the other hand, from the viewpoint of cost reduction, a photosensitive resin composition requiring only a short time for exposure, that is, a photosensitive resin composition exhibiting high sensitivity, is desired. For this reason, a polybenzoxazole precursor resin having high transparency to i-lines is desired.

The bis(aminophenol) derivative of the present invention is a suitable diamine raw material for producing the polybenzoxazole precursor resin satisfying these requirements. The bis(aminophenol) derivative shown by the following formula (1) is particularly preferable.

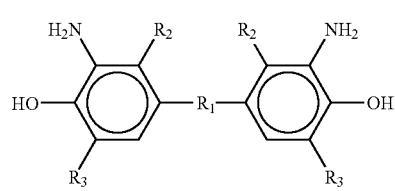

wherein $R_1$ shows an alkylene group, a substituted alkylene group, —O—, —S—, —SO$_2$—, —CO—, —NHCO—, a single bond, or an organic group selected from the groups shown by the following formula (3), $R_2$ individually represents an alkyl group, an alkoxy group, an acyloxy group, or a cycloalkyl group, and $R_3$ individually represents a hydrogen atom, an alkyl group, an alkoxy group, an acyloxy group, or a cycloalkyl group,

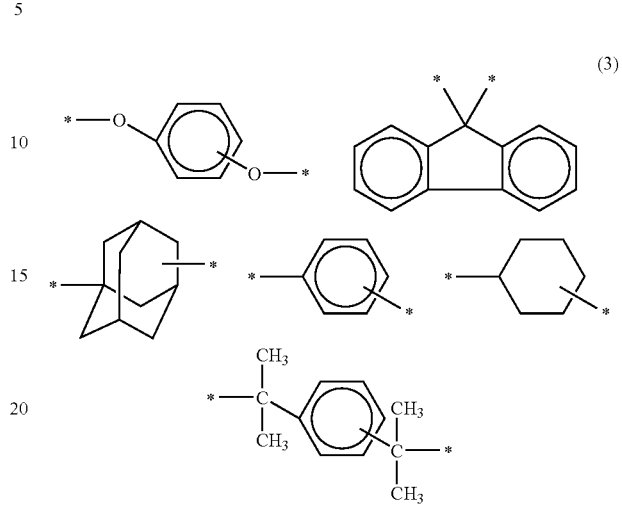

wherein the asterisk (*) indicates one of the aminophenol groups of the bis(aminophenol) derivative shown by the formula (1).

The "single bond" in the definition of $R_1$ in the formula (1) indicates that the aromatic rings of the two aminophenol groups bond directly to each other.

The polybenzoxazole precursor resin can be obtained by reacting the bis(aminophenol) derivative of the present invention with a dicarboxylic acid derivative such as dicarboxylic acid or dicarboxylic acid dichloride which produces a polyamide resin by forming an amide bond by reacting with an diamine compound under suitable conditions. The polybenzoxazole precursor resin obtained in this manner can be suitably used as a protective film and an interlayer dielectric film for a semiconductor element or a display element with high reliability.

When a common bis(aminophenol) derivative which does not have a substituent at positions adjacent to the two amino groups is used as a diamine raw material, a polybenzoxazole precursor resin exhibiting high transparency to i-line and being curable even when cured at a low temperature cannot be obtained. In contrast, if the bis(aminophenol) derivative of the present invention which has a substituent in the position adjacent to the amino group (ortho position) of the aromatic ring in addition to the phenolic hydroxyl group as shown by the formula (1) is used, that is, if the bis(aminophenol) derivative of the present invention is used as a diamine raw material, a polybenzoxazole precursor resin exhibiting high transparency to i-line and high cyclization rate even at a low temperature cure can be obtained. The reason is considered to be as follows. It is difficult for the molecule of the polybenzoxazole precursor resin to have a flat structure due to folding of the aromatic rings via $R_1$ on account of the steric hindrance of the substituents represented by $R_2$ in the bis(aminophenol) derivative shown by the formula (1). This makes it difficult for electron charges to transfer in the resin molecule, which brings about the effect of high transparency. In addition, the substituent ($R_2$) at the ortho position of the amino group sterically pushes forward the amide bond in the polybenzoxazole precursor resin, and the carbon atom of the carbonyl group of the amide bond comes close to the carbon atom of the carbonyl group of the amide bond to come close to the phenolic hydroxyl group, whereby the effect of high cyclization can be obtained, even if the resin is cured at a low temperature.

Furthermore, since the exposure process has become a rate-limiting factor due to remarkable downsizing and high integration of semiconductor elements as mentioned above, an increase in the throughput by promoting sensitivity, as well as the properties of maintaining high transparency to i-line and low water adsorption when cured at a low temperature are demanded for polyimide resins or polyimide precursor resins, in order to increase reliability of the most advanced storage elements with low heat resistance and display elements which cannot be processed at a high temperature.

The bis(aminophenol) derivative of the present invention is a suitable diamine raw material for producing the polyimide resin or the polyimide precursor resin satisfying these requirements. The bis(aminophenol) derivative shown by the formula (1) is particularly preferable.

The polyimide resin or the polyimide precursor resin can be obtained by reacting the bis(aminophenol) derivative of the present invention with a tetracarboxylic acid derivative, such as tetracarboxylic acid, tetarcarboxylic acid dianhydride, or tetradicarboxylic acid tetrachloride, which produces a polyimide resin by forming an imide bond by reacting with a diamine compound under suitable conditions.

The polyimide precursor resin obtained in this manner can be suitably used as a protective film and an interlayer dielectric film for a semiconductor element or a display element with high reliability.

When a common bis(aminophenol) derivative is used as a diamine raw material, a polyimide resin or a polyimide precursor resin exhibiting high transparency to i-lines and having a low moisture absorption rate even when cured at a low temperature cannot be obtained. In contrast, if the bis(aminophenol) derivative of the present invention which has a substituent in the position adjacent to the amino group (ortho position) of the aromatic ring in addition to the phenolic hydroxyl group as shown by the formula (1) is used, that is, if the bis(aminophenol) derivative of the present invention is used as a diamine raw material, a polyimide resin or a polyimide precursor resin exhibiting high transparency to i-line and having a low moisture absorption rate even when cured at a low temperature can be obtained. The reason is considered to be as follows. It is difficult for the molecule of the polybenzoxazole precursor resin to have a flat structure due to folding of the aromatic rings via $R_1$ on account of the steric hindrance of the substituents represented by $R_2$ in the bis(aminophenol) derivative shown by the formula (1). This makes it difficult for electron charges to transfer in the resin molecule, which brings about the effect of high transparency. In addition, the substituent ($R_2$) at the ortho position of the amino group sterically pushes forward the imide bond in the polyimide resin or the imide bond formed from the polyimide precursor resin after curing into the polyimide resin, and the carbon atom of the carbonyl group of the amide bond comes close to the carbon atom of the carbonyl group of the amide bond to come close to the phenolic hydroxyl group. The carbonyl group of the amide bond and the phenolic hydroxyl group thus interact to hinder the reactions with external water, whereby the effect of low water adsorption can be obtained, even if the resin is cured at a low temperature.

Specific structures of the bis(aminophenol) derivative shown by the formula (1) include, but are not limited to, the structures shown by the following formulas (4) to (9),

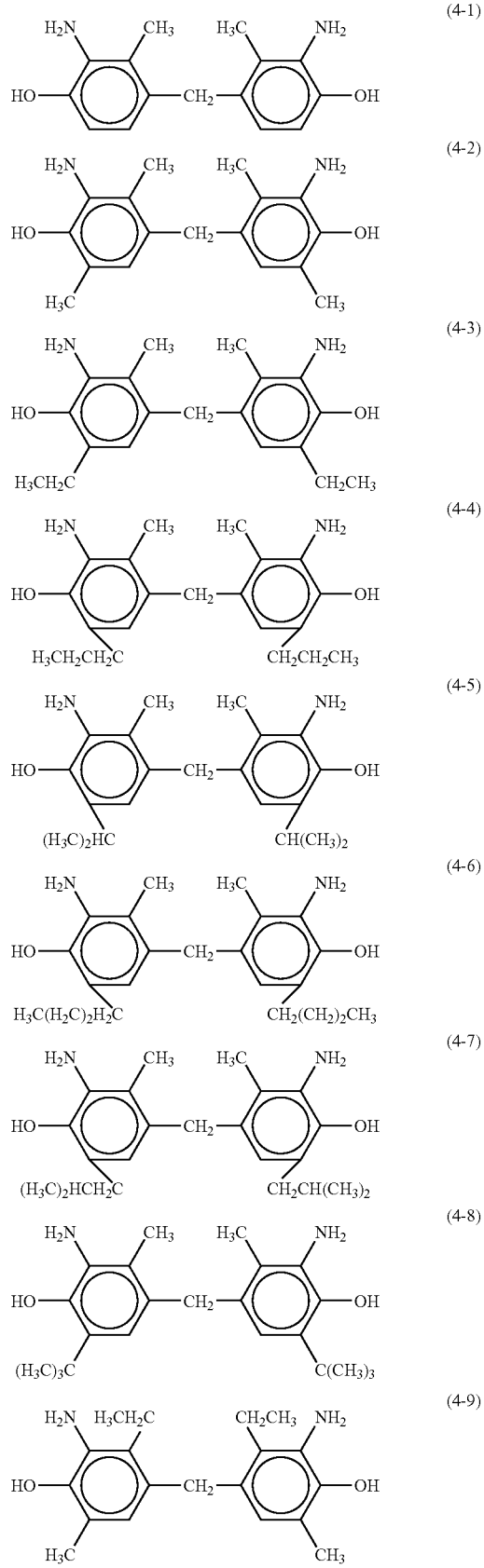

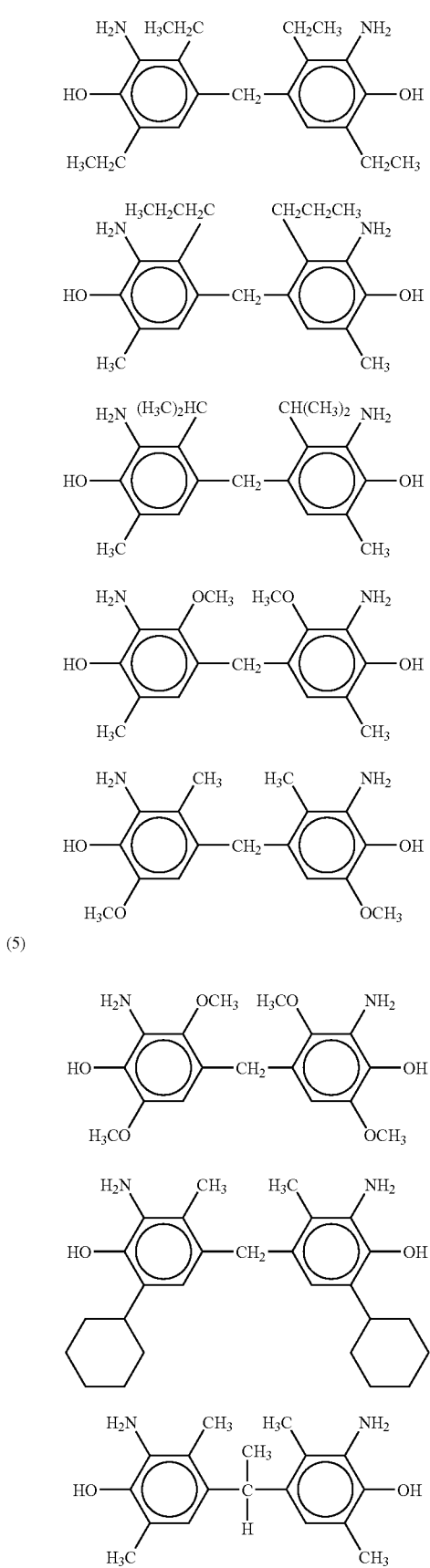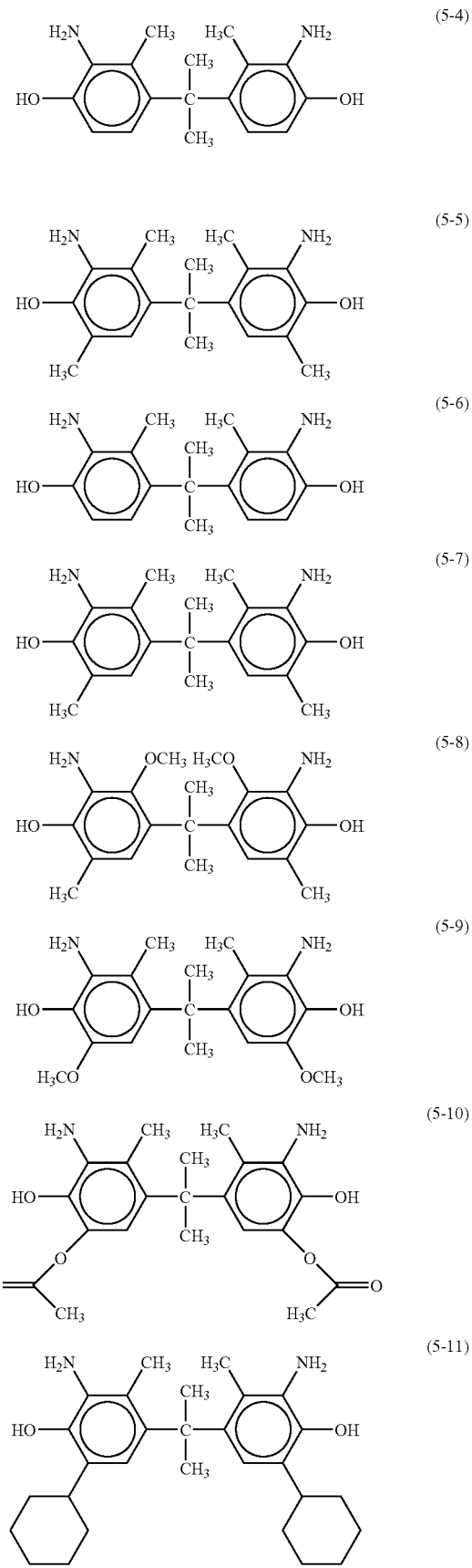

(5-12) 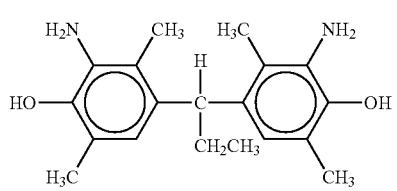
(5-13) 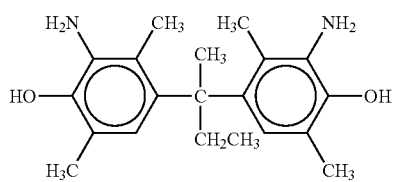
(5-14) 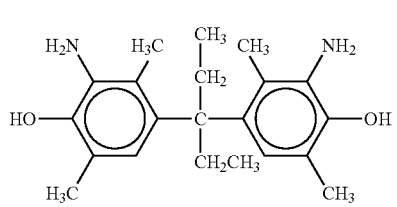
(6)
(6-1) 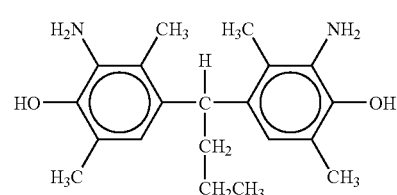
(6-2) 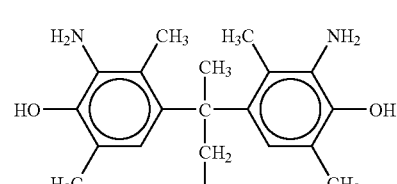
(6-3) 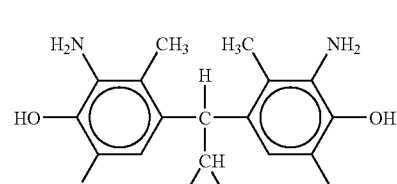
(6-4) 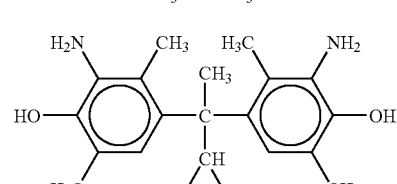
(6-5) 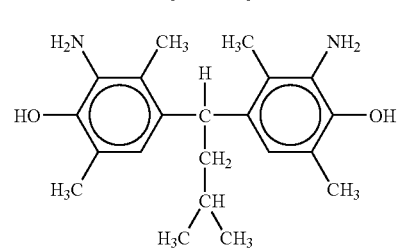
(6-6) 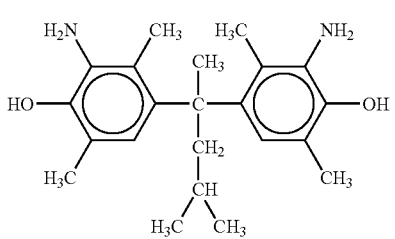
(6-7) 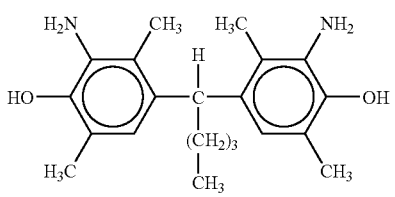
(6-8) 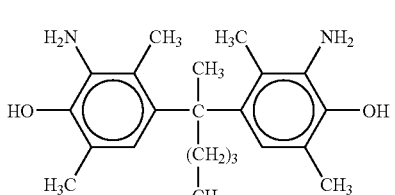
(6-9) 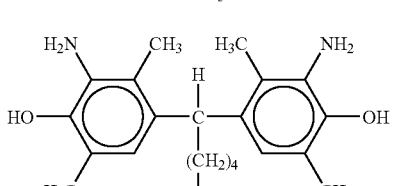
(6-10) 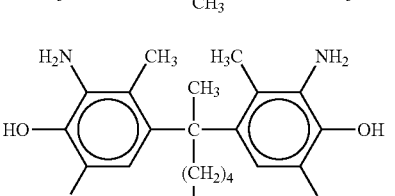
(6-11) 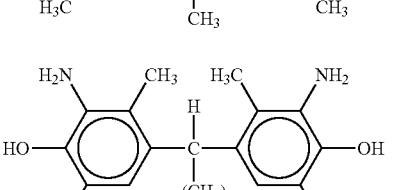
(6-12) 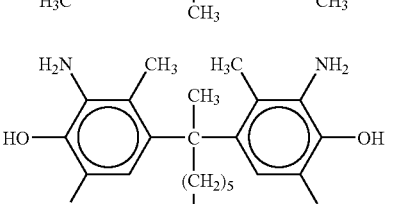
(6-13) 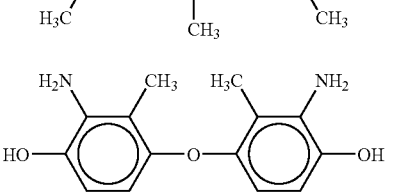

(6-14)
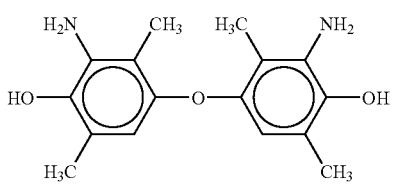
(7)
(7-1)
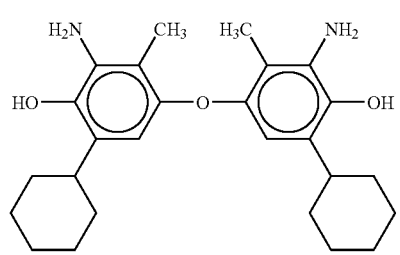
(7-2)
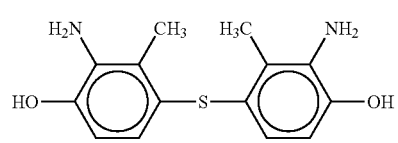
(7-3)
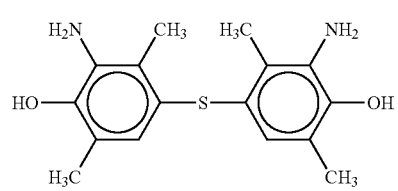
(7-4)
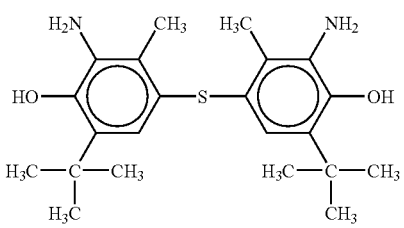
(7-5)
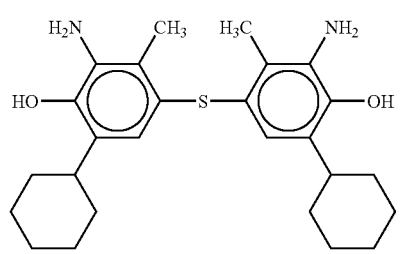
(7-6)
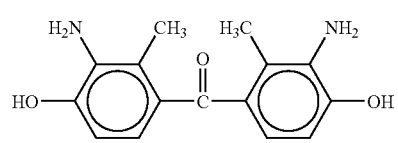
(7-7)
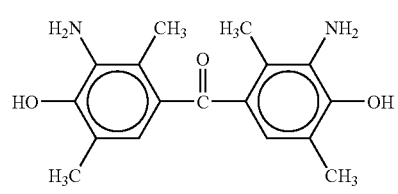
(7-8)
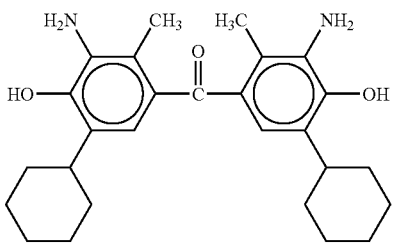
(7-9)
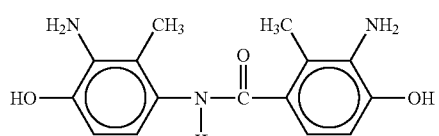
(7-10)
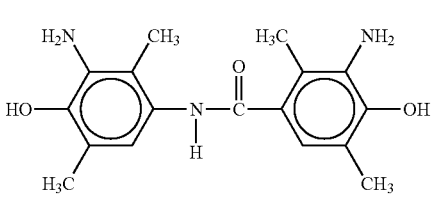
(7-11)
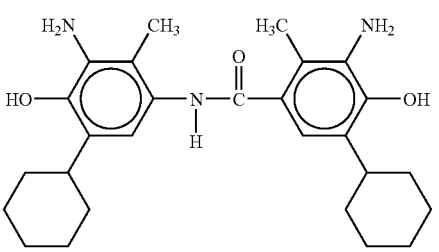
(7-12)
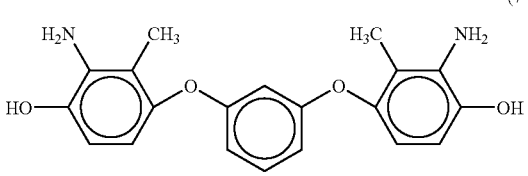
(8)
(8-1)
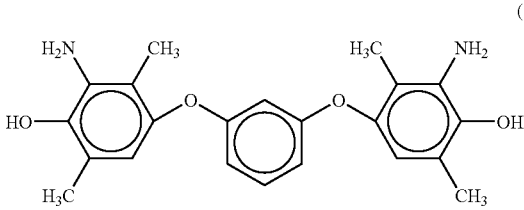
(8-2)
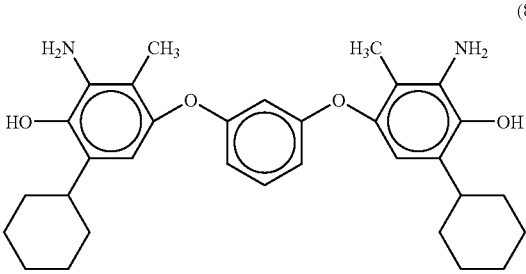

(8-3) 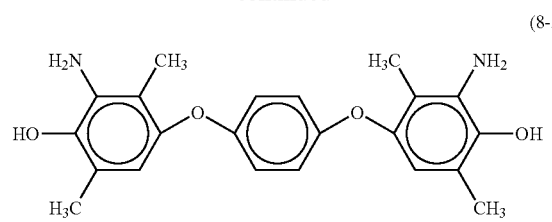
(8-4) 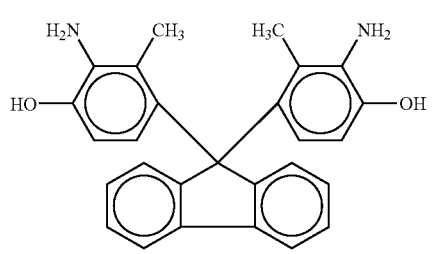
(8-5) 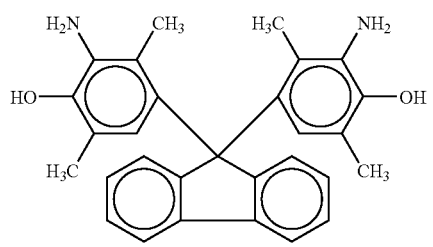
(8-6) 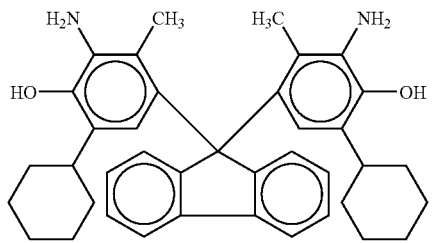
(8-7) 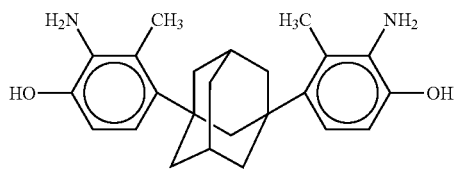
(8-8) 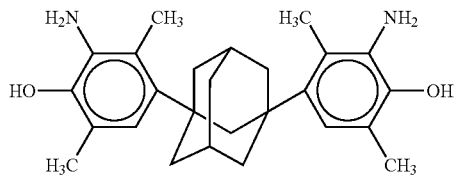
(8-9) 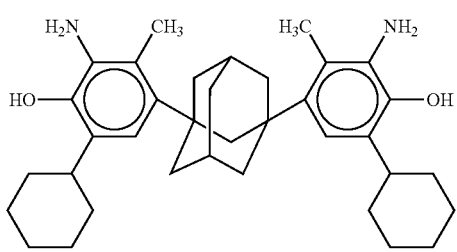
(8-10) 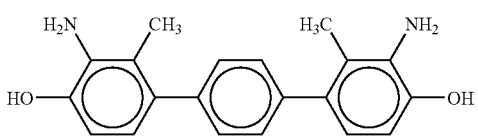
(8-11) 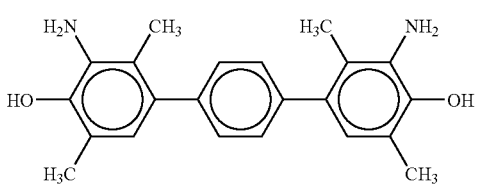
(9)
(9-1) 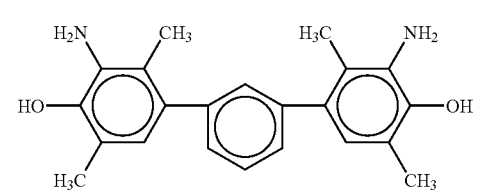
(9-2) 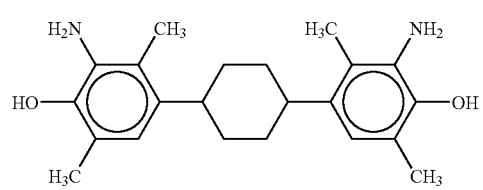
(9-3) 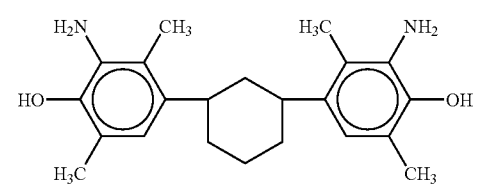
(9-4) 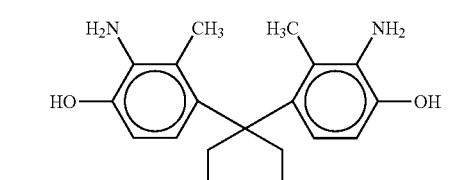
(9-5) 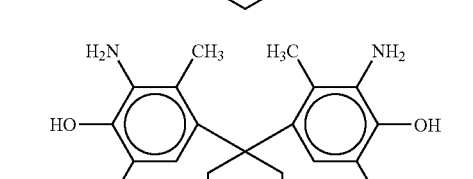
(9-6) 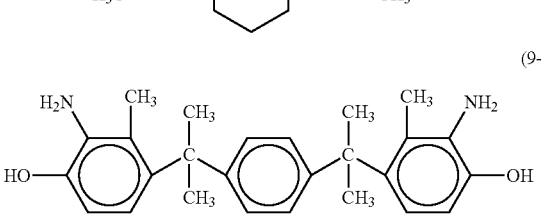

-continued

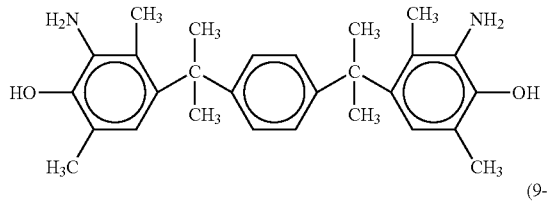

(9-7)

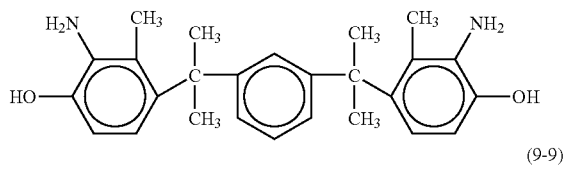

(9-8)

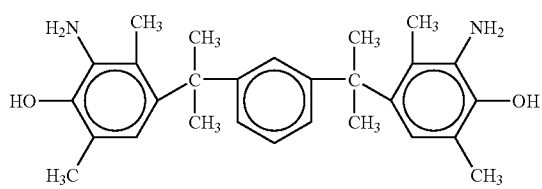

(9-9)

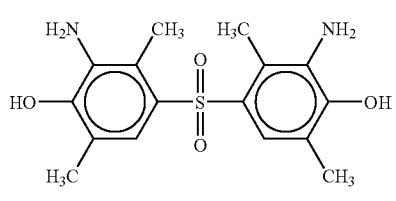

(9-10)

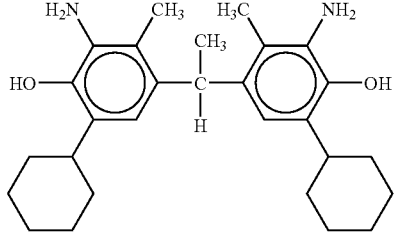

(9-11)

The bis(aminophenol) derivative of the present invention is preferably a compound shown by the formula (1).

The existence of a substituent in the ortho position of the phenolic hydroxyl group, that is, a substituent $R_3$ in the formula (1) is considered to further reduce the distance between the carbonyl carbon of the amide bond and the hydroxyl group. Such a structure is particularly preferable for further promoting the effect of a high cyclization rate when cured at a low temperature.

A bis(aminophenol) derivative having an alkyl group for both of the $R_2$ and the $R_3$ in the formula (1) is particularly preferable for obtaining a polyamide resin having well-balanced properties of high transparency to i-line, a high cyclization rate when cured at a low temperature, and sufficient solubility in an alkaline aqueous solution.

A bis(aminophenol) derivative having an alkylene group or a substituted alkylene group as $R_1$ in the formula (1) is more preferable. As specific examples of the alkylene group and the substituted alkylene group shown by $R_1$, —$CH_2$—, —CH($CH_3$)—, —C($CH_3$)$_2$—, —CH($CH_2CH_3$)—, —C($CH_3$)($CH_2CH_3$)—, —C($CH_2CH_3$)($CH_2CH_3$)—, —CH($CH_2CH_2CH_3$)—, —C($CH_3$)($CH_2CH_2CH_3$)—, —CH(CH($CH_3$)$_2$)—, —C($CH_3$)(CH($CH_3$)$_2$)—, —CH($CH_2CH_2CH_2CH_3$)—, —C($CH_3$)($CH_2CH_2CH_2CH_3$)—, —CH($CH_2CH(CH_3)_2$)—, —C($CH_3$)($CH_2CH(CH_3)_2$)—, —CH($CH_2CH_2CH_2CH_2CH_3$)—, —C($CH_3$)($CH_2CH_2CH_2CH_2CH_3$)>, —CH($CH_2CH_2CH_2CH_2CH_2CH_3$)—, —C($CH_3$)($CH_2CH_2CH_2CH_2CH_3$)—, and the like can be given. Of these, —$CH_2$—, —CH($CH_3$)—, and —C($CH_3$)$_2$— are more preferable to produce a polyamide resin having well-balanced properties of high transparency to i-line, a high cyclization rate when cured at a low temperature, and sufficient solubility in an alkaline aqueous solution.

As a process for producing the bis(aminophenol) derivative of the present invention, a method of nitrating the bisphenol derivative starting raw material shown by the following formula (10) using a nitrating agent to synthesize a bis(nitrophenol) derivative shown by the following formula (2), and reducing the resulting bis(nitrophenol) derivative into a bis(aminophenol) derivative by converting the nitro group into an amino group can be given.

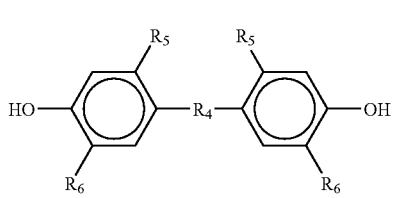

(10)

wherein $R_4$ is an organic group selected from the group consisting of an alkylene group, a substituted alkylene group, —O—, —S—, —$SO_2$—, —CO—, and —NHCO—, or a single bond, $R_5$ individually represents an alkyl group, an alkoxy group, an acyloxy group, or a cycloalkyl group, and $R_6$ individually represents a hydrogen atom, an alkyl group, an alkoxy group, an acyloxy group, or a cycloalkyl group.

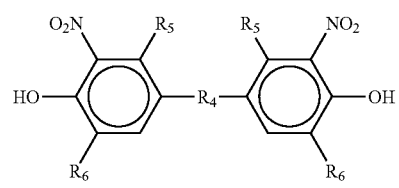

(2)

wherein $R_4$ is an organic group selected from the group consisting of an alkylene group, a substituted alkylene group, —O—, —S—, —$SO_2$—, —CO—, and —NHCO—, or a single bond, $R_5$ individually represents an alkyl group, an alkoxy group, an acyloxy group, or a cycloalkyl group, and $R_6$ individually represents a hydrogen atom, an alkyl group, an alkoxy group, an acyloxy group, or a cycloalkyl group.

As a method for nitrating the bisphenol derivative shown by the formula (10), a method of reacting the bisphenol derivative with a nitrating agent such as nitric acid or an acid mixture containing nitric acid, a metal nitrate, and a nitronium salt in a solvent such as toluene, xylene, mesitylene, chloroform, dichloromethane, and acetic anhydride can be given, for example.

As a method for reducing the bis(nitrophenol) derivative shown by the formula (2), a method of reducing the nitro group of the bis(nitrophenol) derivative with a reducing agent such as stannous chloride dihydrate or sodium hydrosulfite can be given, for example.

A method of reducing the nitro group of the bis(nitrophenol) derivative shown by the formula (2) into an amino group using a transition metal catalyst such as a palladium/activated carbon catalyst, a platinum/activated carbon catalyst, or a Raney nickel catalyst in a solvent such as ethanol, carbon tetrachloride, dichloroethane, dichloromethane, methylene chloride, tetrahydrofuran, a mixed solvent of tetrahydrofuran and ethanol (or other alcohols such as methanol), N,N-dimethylformamide, toluene, dimethyl sulfoxide, γ-butyrolactone, and N-methyl-2-pyrrolidone, while stirring in a hydrogen atmosphere, can also be given. A bis(aminophenol) derivative containing only a small amount of ionic impurities such as chloride ion or a sodium ion can be obtained by this method. There are no specific limitations to the reaction time and the amount of the solvent in the reaction. The amount of the transition metal catalyst used is preferably 0.1 to 10 mol % of the bis(nitrophenol) derivative shown by the formula (2). A smooth reducing reaction can be ensured by using the transition metal catalyst in an amount in this range.

Although the bis(aminophenol) derivative shown by the formula (1) obtained by the above reducing reaction can be used as is after removing the catalyst by filtration or the like and evaporating the solvent, it is possible to increase the purity by refining by means of recrystallizing using a solvent such as an alcoholic solvent such as methanol and ethanol, an amphiphilic solvent such as N,N-dimethylformamide and dimethylsulfoxide, hexane, diethyl ether, tetrahydrofuran, and water, either alone or using two or more of them.

Although the above synthesis reaction route is generally used for manufacturing the bis(aminophenol) derivative of the present invention, the manufacturing method is not limited to this synthesis reaction route.

The polyamide resin (A) of the present invention includes bis(aminophenol) and a structure derived from carboxylic acid, in which the bis(aminophenol) has substituents at positions adjacent to the two amino groups.

The polyamide resin (A) is obtained by the reaction of a diamine component and a carboxylic acid component, wherein all or a part of the diamine component is the bis (aminophenol) derivative of the present invention.

The polyamide resin (A) in the present invention refers to a resin in which the main chain bonds by an amide bond, an imide bond, or a benzoxazole structure or by a combination of two or more of these. The polyamide resin (A) of the present invention has a benzoxazole precursor structure, a benzoxazole structure, an imide structure, an imide precursor structure, or an amide ester structure or a combination of two or more of these. Therefore, the polyamide resin (A) of the present invention includes (i) a polyamide resin having a benzoxazole precursor structure or a polybenzoxazole precursor resin having a benzoxazole precursor structure as a major component, (ii) a polyamide resin having a benzoxazole structure or a polybenzoxazole resin having a benzoxazole structure as a major component, (iii) a polyamide resin having both a benzoxazole precursor structure and a benzoxazole structure, that is, a polyamide resin in which a part of the benzoxazole precursor structure in the polyamide resin (i) is cyclized into a benzoxazole structure, (iv) a polyamide resin having an imide precursor structure or a polyimide precursor resin having an imide precursor structure as a major component, (v) a polyamide resin having an imide structure or a polyimide resin having an imide structure as a major component, (vi) a polyamide resin having both an imide precursor structure and an imide structure, that is, a polyamide resin in which a part of the imide precursor structure in the polyamide resin (iv) is cyclized into an imide structure, (vii) a polyamide resin having both a benzoxazole precursor structure or a benzoxazole structure and an imide precursor structure or an imide structure, and (viii) a resin having a benzoxazole precursor structure, a benzoxazole structure, an imide structure, an imide precursor structure, or an amide ester structure or a combination of two or more of these. The polyamide resin (A) of the present invention may further contain a hydroxyl group, a carboxyl group, an ether group, or an ester group in the main chain or a side chain.

Although not specifically limited, the number average molecular weight of the polyamide resin (A) of the present invention is preferably from 3,000 to 100,000, and particularly preferably from 5,000 to 80,000.

The positive-type photosensitive resin composition comprises (A) the polyamide resin of the present invention and (B) a photosensitive diazoquinone compound. The protecting film and the interlayer dielectric film of the present invention are made of a cured material of the positive-type photosensitive resin composition of the present invention. Furthermore, the semiconductor device and display element of the present invention include the protecting film and interlayer dielectric film of the present invention.

Each component of the polyamide resin (A) and the positive-type photosensitive resin composition of the present invention is described in detail below. The following descriptions are given as examples and are not intended to limit the present invention.

All or a part of the diamine component of the bis(aminophenol) used for the polyamide resin (A) of the present invention, that is, the diamine component of the polyamide resin (A) of the present invention, is the bis(aminophenol) derivative of the present invention. Details of the bis(aminophenol) derivative have been described above.

A part of the diamine component of the polyamide resin (A) may be a diamine other than the bis(aminophenol) derivative of the present invention. Any diamines generally used for preparing polyamide resins may be used as the diamine component without particular limitation.

As the carboxylic acid component of the polyamide resin (A), any carboxylic acids generally used as the component of polyamide resins may be used without particular limitation.

From the viewpoint of obtaining a polyamide resin (A) exhibiting high heat resistance and high reliability after final heating, among the polyamide resins (A) of the present invention, as specific examples of preferably used polyamide resins having a benzoxazole precursor structure, polyamide resins obtained by a reaction of a diamine component and a carboxylic acid component, in particular, polyamide resins obtained by random copolymerization of the structural units shown by the following formulas (13-1) and (13-2) as structural units derived from the diamine component and the structural unit shown by the following formula (13-3) as a structural unit derived from the carboxylic acid component by amide bonding (hereinafter referred to from time to time as "a polyamide resin obtained by random copolymerization of structural units (13-1), (13-2), and (13-3)") can be given. Particularly preferable polyamide resins are polyamide resins obtained by a reaction of a diamine component and a carboxylic acid component, in particular, polyamide resins obtained by random copolymerization of the structural units shown by the following formulas (14-1) and (14-2) as structural units derived from the diamine component and the structural unit shown by the following formula (14-3) as a structural unit derived from the carboxylic acid component by amide bonding (hereinafter referred to from time to time as "a polyamide resin obtained by random copolymerization of structural units (14-1), (14-2), and (14-3)"). Either one structural unit or two or more structural units shown by the following formula (13-1) may be used. Specifically, either a diamine component having the same $R_1$, the same $R_2$, and the same $R_3$ in the structural unit shown by following formula (13-1) or each having different $R_1$, $R_2$, or $R_3$ from the other may be used. Likewise, either one structural unit or two or more structural units shown by the following formula (13-2) may be used. Specifically, either a diamine component having the same $R_{10}$, the same m, and the same X in the structural unit shown by following formula (13-2) or two or more diamine components, each having an $R_{10}$, m, or X differing from the other may be used. Similarly, either one structural unit or two or more structural units shown by the following formula (13-3) may be used. Specifically, either a carboxylic acid component having the same $R_{11}$, the same n, and the same Y in the structural unit shown by following formula (13-3) or two or more carboxylic acid components, each having an $R_{11}$, n, or Y differing from the other may be used. In the following formulas (13-1), (13-2), and (13-3), a and b indicate the number of each structural unit in the resin and do not indicate that each structural unit is continuously linked. In the same way, either one structural unit or two or more structural units shown by the following formula (14-1) may be used. Specifically, either a diamine component having the same $R_1$, the same $R_2$, and the same $R_3$ in the structural unit shown by following formula (14-1) or each having an $R_1$, $R_2$, or $R_3$ differing from the other may be used. Also, either one structural unit or two or more structural units shown by the following formula (14-2) may be used. Specifically, either a diamine component having the same $R_{12}$, the same p, and the same X in the structural unit shown by following formula (14-2) or two or more diamine components, each having an $R_{12}$, p, or X differing from the other may be used. Similarly, either one structural unit or two or more structural units shown by the following formula (14-3) may be used. Specifically, either a carboxylic acid component having the Y in the structural unit shown by following formula (14-3) or two or more carboxylic acid components, each having a Y differing from the other may be used. In the following formulas (14-1), (14-2), and (14-3), c and d indicate the number of each structural unit in the resin and do not indicate that each structural unit is continuously linked. Copolymers having a benzoxazole structure or an imide structure derived from a benzoxazole precursor structure or an imide precursor structure by cyclization are also included in either of "the polyamide resin in which the structural units shown by the formulas (13-1), (13-2), and (13-3) are randomly copolymerized" or "the polyamide resin in which the structural units shown by the formulas (14-1), (14-2), and (14-3) are randomly copolymerized".

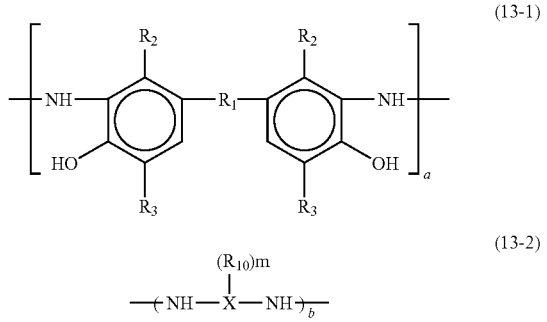

(13-1)

(13-2)

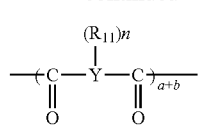

(13-3)

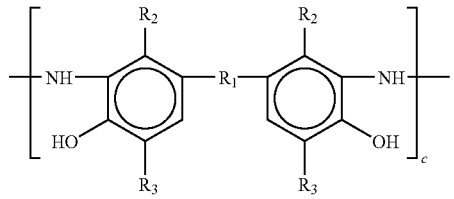

(14-1)

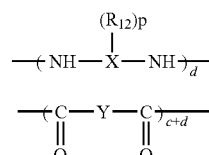

(14-2)

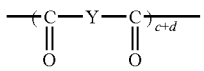

(14-3)

In the formulas (13-1), (13-2), (13-3), (14-1), (14-2), (14-3), and the later-described formula (37), X and Y are organic groups, and a, b, c, and d represent the number of each structural unit in the resin and are individually an integer of 1 or more. In the polyamide resin in which the structural units shown by the formulas (13-1), (13-2), and (13-3) are randomly copolymerized, the mol percent of (13-1) in the diamine component, specifically, $\{a/(a+b)\}\times100(\%)$ is 30 to 100, and the mol percent of (13-2) in the diamine component, specifically, $\{b/(a+b)\}\times100(\%)$, is 0 to 70. In the polyamide resin in which the structural units shown by the formulas (14-1), (14-2), and (14-3) are randomly copolymerized, the mol percent of (14-1) in the diamine component, specifically, $\{c/(c+d)\}\times100(\%)$, is 30 to 100, and the mol percent of (14-2) in the diamine component, specifically, $\{d/(c+d)\}\times100(\%)$, is 0 to 70. In the formulas, $R_1$, $R_2$, and $R_3$ are the same as the $R_1$, $R_2$, and $R_3$ in the formula (1), $R_{10}$ and $R_{12}$ represent a hydroxyl group or —O—$R_{13}$, two or more $R_{10}$s and $R_{12}$s may be either the same or different, $R_1$ represents a hydroxyl group, a carboxyl group, —$R_{13}$, or —COO—$R_{13}$, two or more $R_{11}$s may be either the same or different, m is an integer of 0 to 2, n is an integer of 0 to 4, and p is 2, and $R_{13}$ represents an organic group having 1 to 15 carbon atoms. When none of the $R_{10}$s in the structural unit (13-2) is a hydroxyl group, at least one of the $R_{11}$s in the structural unit (13-3) must be a carboxyl group. When none of the $R_{11}$s in the structural unit (13-3) is a carboxyl group, at least one of the $R_{10}$s in the structural unit (13-2) must be a hydroxyl group.

If $\{a/(a+b)\}\times100(\%)$ is 30 mol % or more in the polyamide resin in which the structural units (13-1), (13-2), and (13-3) are randomly copolymerized, the polyamide resin exhibits high transparency to i-line and a high cyclization rate even if cured at a low temperature. If $\{c/(c+d)\}\times100(\%)$ is 30 mol % or more in the polyamide resin in which the structural units (14-1), (14-2), and (14-3) are randomly copolymerized, the polyamide resin exhibits high transparency to i-line and a high cyclization rate even if cured at a low temperature.

The polyamide resin in which the structural units (13-1), (13-2), and (13-3) are randomly copolymerized is obtained, for example, by reacting a bis(aminophenol) derivative shown by the formula (1) and, as required, a diamine, bis (aminophenol) is having X, or 2,4-diaminophenol as a diamine component, and tetracarboxylic acid dianhydride, trimellitic acid anhydride, dicarboxylic acid, dicarboxylic acid dichloride, dicarboxylic acid derivative, hydroxydicarboxylic acid, or hydroxydicarboxylic acid derivative having Y as a carboxylic acid component.

The polyamide resin in which the structural units (14-1), (14-2), and (14-3) are randomly copolymerized is obtained, for example, by reacting a bis(aminophenol) shown by the formula (1) and, as required, bis(aminophenol) having X or 2,4-diaminophenol as a diamine component, and dicarboxylic acid, dicarboxylic acid dichloride, or a dicarboxylic acid derivative having Y as a carboxylic acid component. In the case of the dicarboxylic acid, an active ester-type dicarboxylic acid derivative previously reacted with 1-hydroxy-1,2,3-benzotriazole or the like may be used in order to increase the reaction yield.

In the formulas (13-2), (13-3), and (14-2), —O—$R_{13}$ as the substituent of X, and —O—$R_{13}$ and —COO—$R_{13}$ as the substituent of Y are groups by which a hydroxyl group or a carboxyl group is protected by $R_{13}$ which is an organic group having 1 to 15 carbon atoms so as to adjust the solubility in an alkaline aqueous solution. The hydroxyl group or the carboxyl group may be protected in this manner, as required. As examples of $R_{13}$, a formyl group, a methyl group, an ethyl group, a propyl group, an isopropyl, a tert-butyl group, a tert-butoxycarbonyl group, a phenyl group, a benzyl group, a tetrahydrofuranyl group, a tetrahydropyranyl group, and the like can be given.

As specific examples of the polyamide resin (A) of the present invention, a polyamide resin shown by the following formula (37) can be given. The following formula (37) represents a structure derived from a bis(aminophenol) derivative shown by the formula (1) and a carboxylic acid.

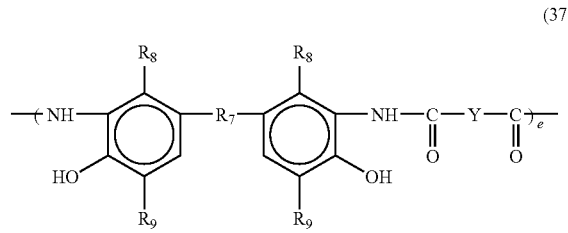

(37)

wherein $R_7$ is an organic group selected from the group consisting of an alkylene group, a substituted alkylene group, —O—, —S—, —SO$_2$—, —CO—, and —NHCO—, or a single bond, $R_8$ individually represents an alkyl group, an alkoxy group, an acyloxy group, or a cycloalkyl group, $R_9$ individually represents a hydrogen atom, an alkyl group, an alkoxy group, an acyloxy group, or a cycloalkyl group, Y is an organic group and the same as the Y in the formulas (13-1), (13-2), (13-3), (14-1), (14-2), and (14-3), and e is an integer of 1 or more.

Among the polyamide resins (A) of the present invention, the polyamide resin having a benzoxazole precursor structure is cyclized by dehydration if heated at a high temperature of between 280° C. and 380° C. or a low temperature of between 150° C. and 280° C. to produce a heat resistant resin such as a polybenzoxazole resin or a copolymer of a polybenzoxazole resin and a polyimide resin. When processed by heating at a low temperature, the yield can be increased even in the case in which semiconductor elements with low heat resistance are produced.

X in the formulas (13-2) and (14-2) is an organic group. As examples, aromatic compounds such as a benzene ring and a naphthalene ring, a bisphenol compound, a heterocyclic compound such as pyrroles and furans, siloxanes, and the like can be given. More specific examples of such a structure include the structures shown by the following formula (15). The diamine components of the formulas (13-2) and (14-2) can be used either individually or in combination of two or more, to the extent not affecting the effect of high transparency to i-linez and a high cyclization rate when cured at a low temperature.

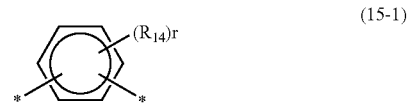

(15-1)

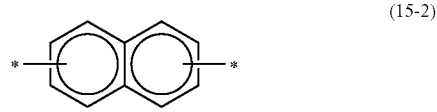

(15-2)

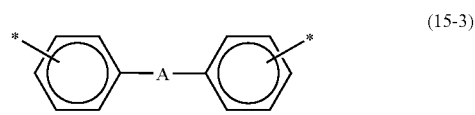

(15-3)

(15-4)

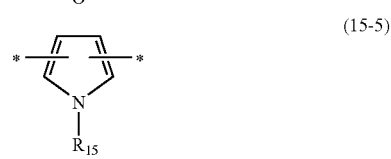

(15-5)

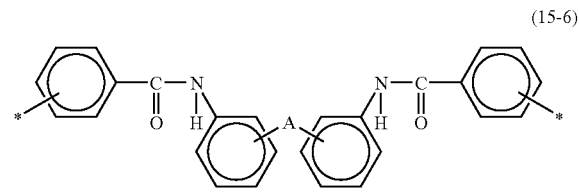

(15-6)

wherein the asterisk (*) indicates —NH, A indicates —CH$_2$—, —C(CH$_3$)$_2$—, —O—, —S—, —SO$_2$—, —CO—, —NHCO—, —C(CF$_3$)$_2$—, or a single bond, $R_{14}$ individually indicates one group selected from the group consisting of an alkyl group, an alkyl ester group, and a halogen atom, $R_{15}$ individually indicates one group selected from the group consisting of a hydrogen atom, an alkyl group, an alkyl ester group, a halogen atom, and r is an integer of 0 to 2.

(15-7)

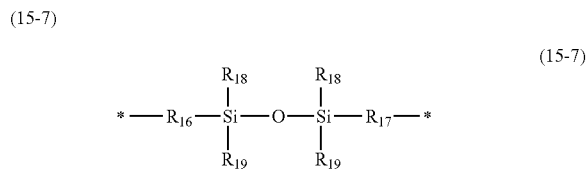

(15-7)

wherein the asterisk (*) indicates —NH and $R_{16}$ to $R_{19}$ indicate organic groups.

As particularly preferable examples of the structures shown by the formula (15), the structures shown by the following formulas (16) and (17) can be given.

(16-1)
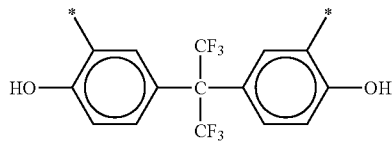

(16-2)
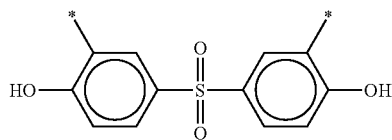

(16-3)
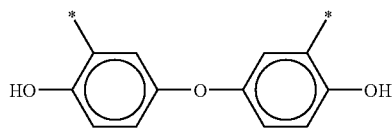

(16-4)
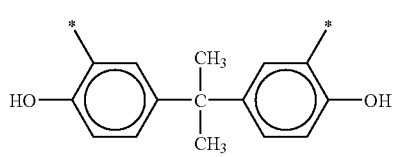

(16-5)
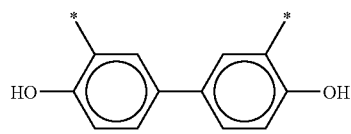

(16-6)
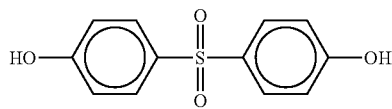

(16-7)
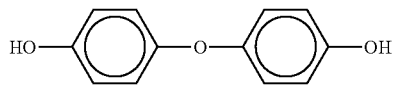

(16-8)
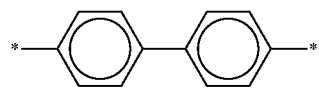

(16-9)
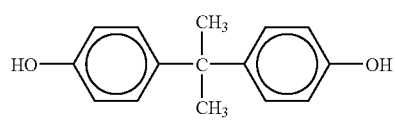

(16-10)
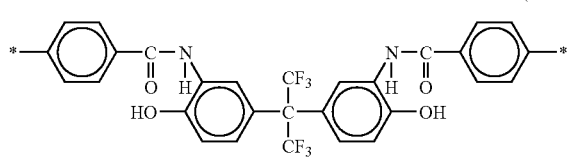

(16-11)
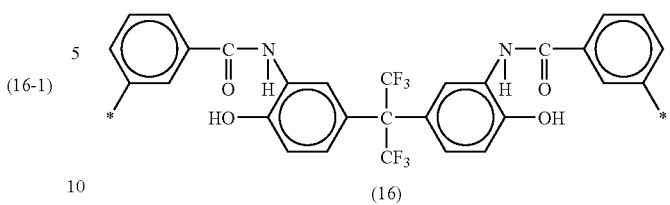

(16-12)
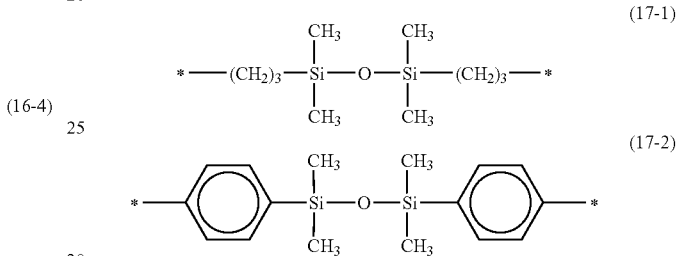

(16)

wherein the asterisk (*) indicates —NH, $R_{20}$ is an alkyl group, an alkyl ester group, or a halogen atom, and if there are two or more $R_{20}$s, the $R_{20}$s may be either the same or different, and s is an integer of 0 to 2.

(17)

(17-1)
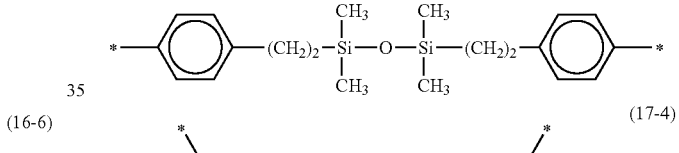

(17-2)
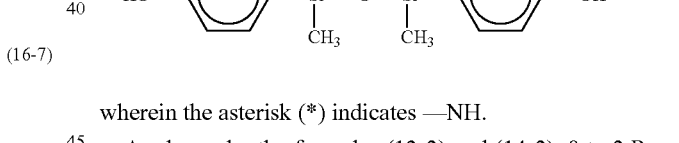

(17-3)
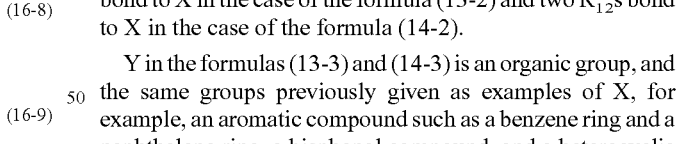

(17-4)
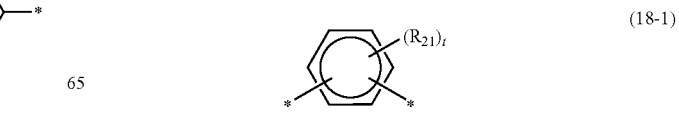

wherein the asterisk (*) indicates —NH.

As shown by the formulas (13-2) and (14-2), 0 to 2 $R_{10}$s bond to X in the case of the formula (13-2) and two $R_{12}$s bond to X in the case of the formula (14-2).

Y in the formulas (13-3) and (14-3) is an organic group, and the same groups previously given as examples of X, for example, an aromatic compound such as a benzene ring and a naphthalene ring, a bisphenol compound, and a heterocyclic compound such as a pyrrole compound, a pyridine compound, and a furan compound can be given as examples. More specific examples of such a structure include the structures shown by the following formula (18). These groups may be used either individually or in combination of two or more as Y.

(18)

(18-1)

(18-2) 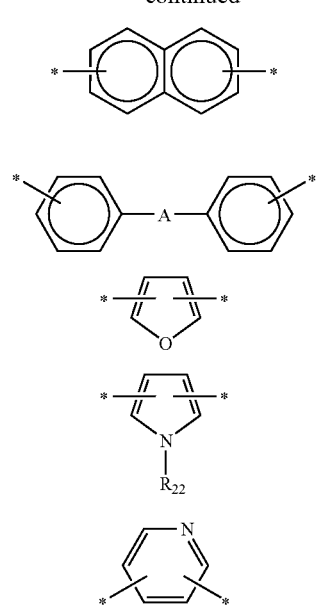

(18-3)

(18-4)

(18-5)

(18-6)

(18-7) 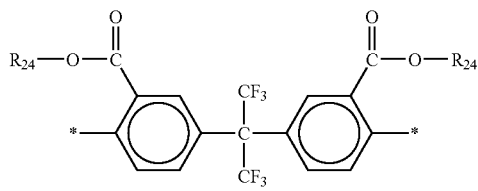

wherein the asterisk (*) indicates —C═O, A indicates —$CH_2$—, —$C(CH_3)_2$—, —O—, —S—, —$SO_2$—, —CO—, —NHCO—, —$C(CF_3)_2$—, or a single bond, $R_{21}$ individually indicates a group selected from the group consisting of an alkyl group, an alkyl ester group, an alkyl ether group, benzyl ether group, and a halogen atom, $R_{22}$ individually indicates a group selected from the group consisting of a hydrogen atom, an alkyl group, an alkyl ester group, a halogen atom, and t is an integer of 0 to 2.

(18-8) 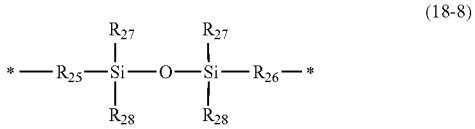

wherein the asterisk (*) indicates —C═O, and $R_{25}$ to $R_{28}$ indicate organic groups.

As particularly preferable examples of the structures shown by the formula (18), structures shown by the following formula (19) can be given.

(19-1) 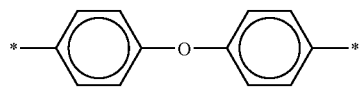

(19-2) 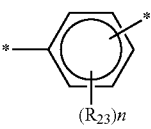

(19-3) 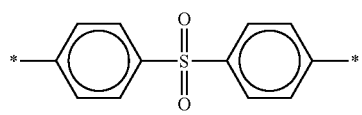

(19-4) 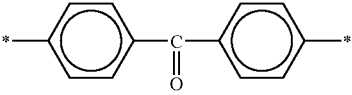

(19-5) 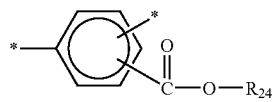

(19-6) 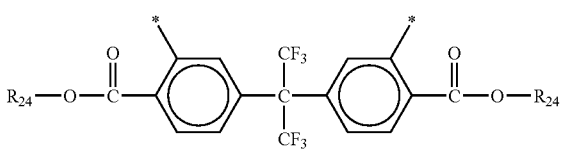

(19-7) 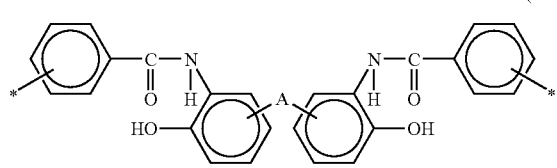

(19-8) 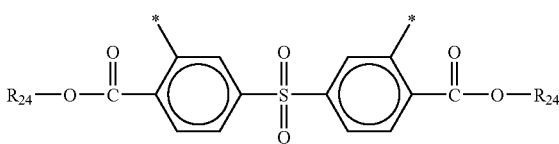

-continued
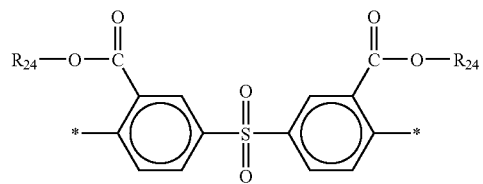
(19-9)
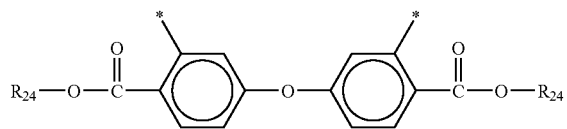
(19-10)
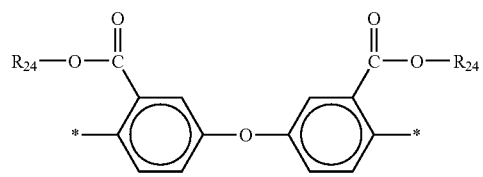
(19-11)
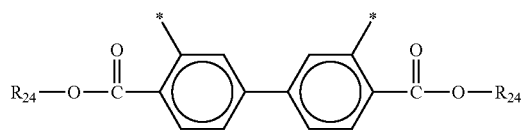
(19-12)
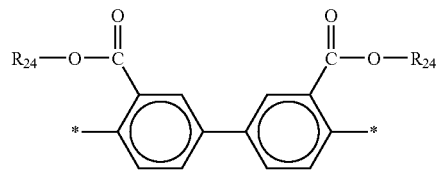
(19-13)
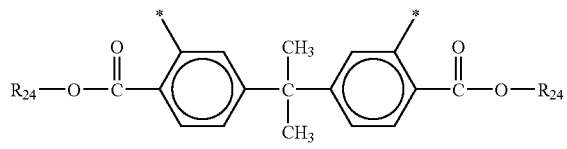
(19-14)
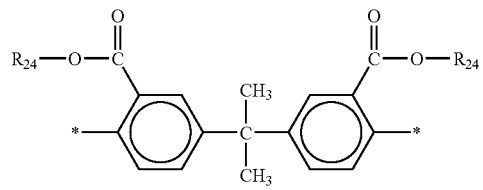
(19-15)
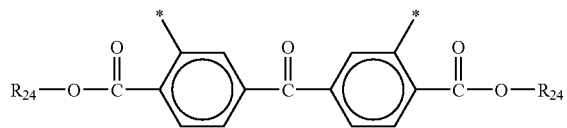
(19-16)
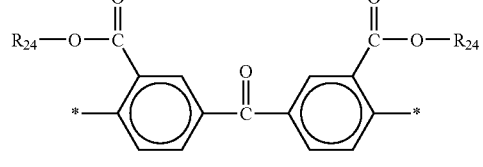
(19-17)
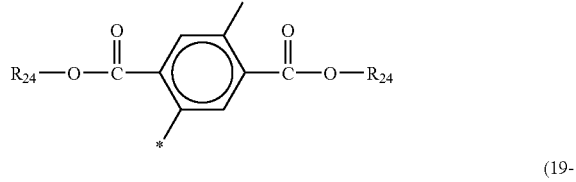
(19-18)
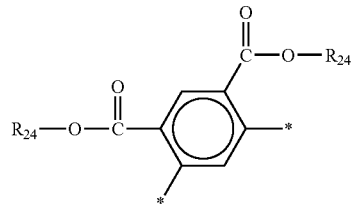
(19-19)
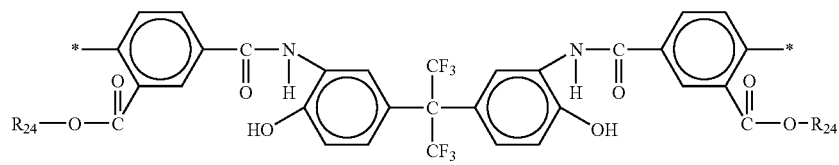
(19-20)
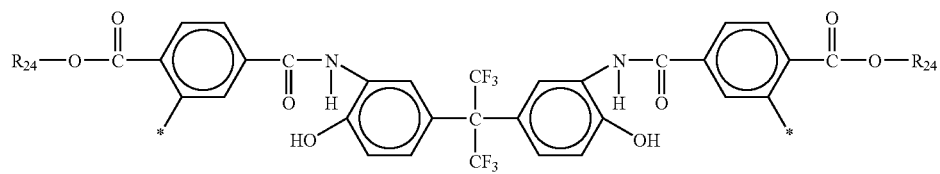
(19-21)

wherein the asterisk (*) indicates —C=O, $R_{23}$ shows one group selected from the group consisting of an alkyl group, an alkyl ester group, an alkyl ether group, a benzyl ether group, and a halogen atom, and if there are two or more $R_{23}$s, the $R_{23}$s may be either the same or different, and $R_{24}$ is a hydrogen atom or an organic group having 1 to 15 carbon atoms, in which some $R_{24}$ group may be substituted, and u is an integer of 0 to 2.

(19)

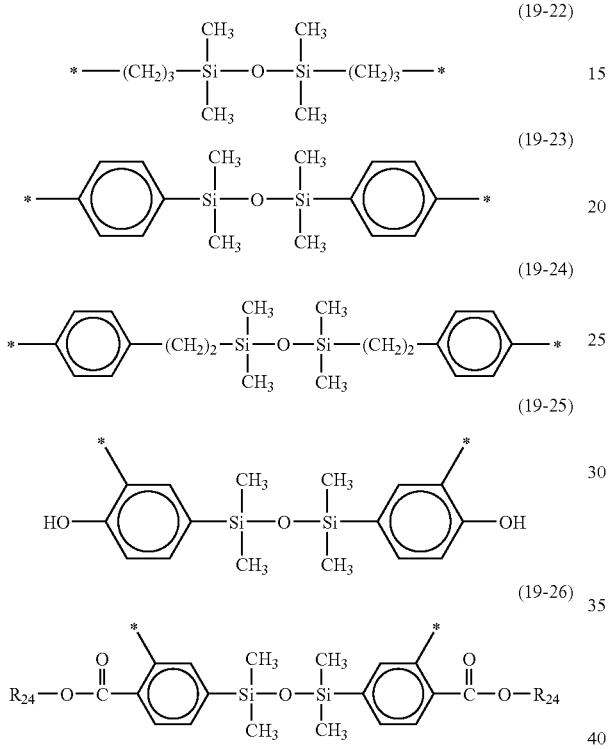

wherein the asterisk (*) indicates —C=O, $R_{24}$ is a hydrogen atom or an organic group having 1 to 15 carbon atoms, in which some $R_{24}$ group may be substituted.

As the structure derived from tetracarboxylic acid in the formula (19), although those in which both positions bonding to the C=O group are meta-positions and those in which both positions bonding to the C=O group are para-positions are given, the structure may include those in which one of the positions is a meta-position and the other is a para-position.

In the formula (13-3), 0 to 4 $R_{11}$s bond to Y.

In the formulas (13-2) and (14-2), b and d indicating the number of structural units including X may be zero.

The amino groups in the terminal of the polyamide resin in which the structural units shown by the formulas (13-1), (13-2), and (13-3) are randomly copolymerized and the polyamide resin in which the structural units shown by the formulas (14-1), (14-2), and (14-3) are randomly copolymerized are preferably capped by an amide group using an acid anhydride containing an aliphatic group or a cyclic compound group having at least one alkenyl group or alkynyl group. The storage stability may be improved in this manner.

As examples of the group derived from such an acid anhydride which includes at least one aliphatic group or a cyclic compound group having at least one alkenyl group or alkynyl group after reacting with an amino group, the groups shown by the following formula (20) or (21) can be given. These groups may be used either individually or in combination of two or more.

(20)

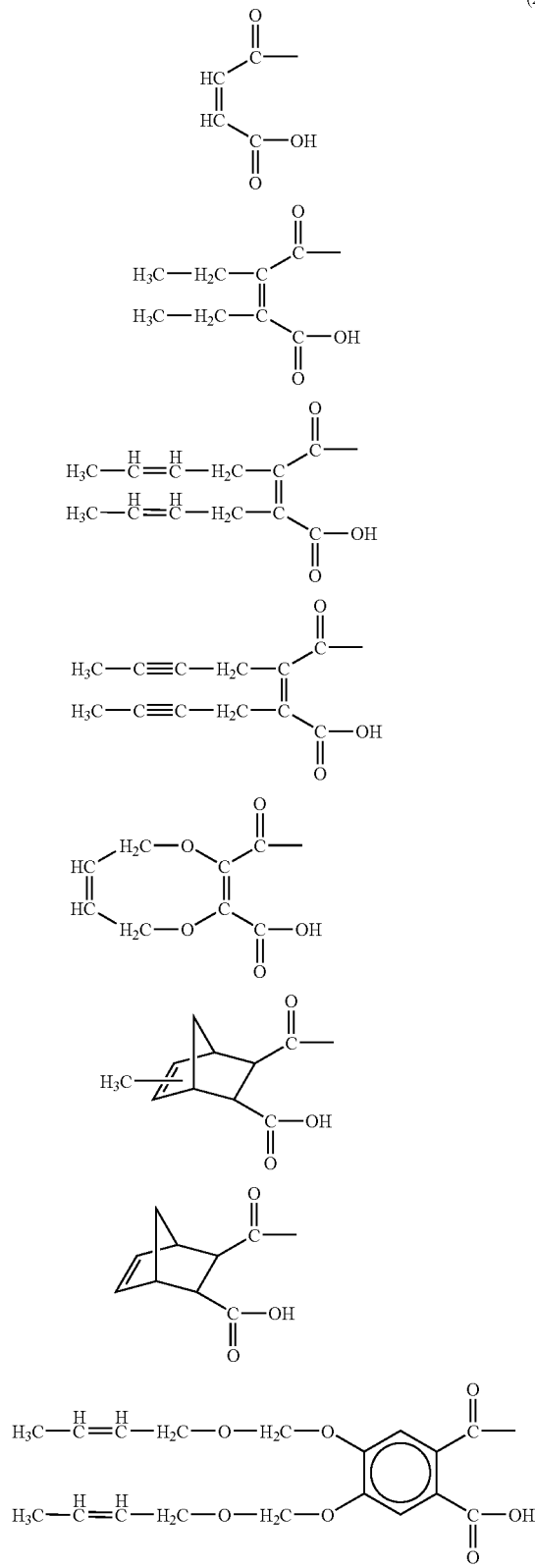

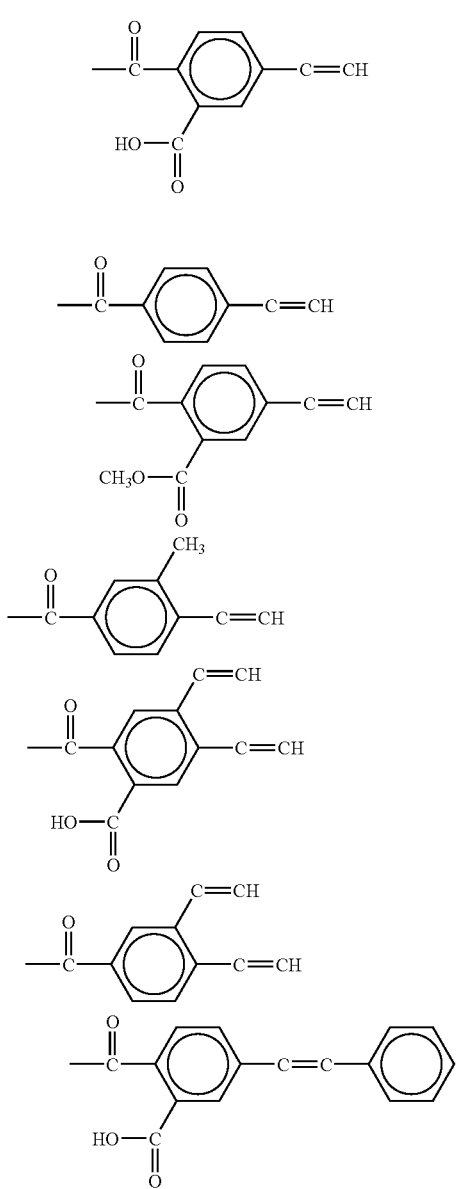

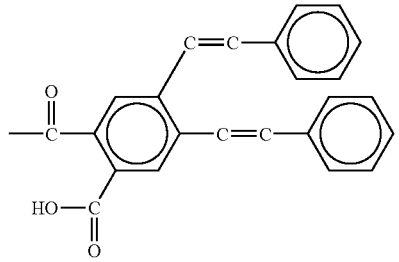

Among the groups shown by the formulas (20) and (21), the groups shown by the formula (22) are particularly preferable. The storage stability may be further improved by using these groups.

(22)

Without being limited to this method, an acid group at the terminal of the polyamide resin (A) of the present invention may be capped as an amide using an amine derivative containing an aliphatic group or a cyclic compound group which has at least one alkenyl group or alkynyl group.

As examples of the photosensitive diazoquinone compound (B) used in the positive-type photosensitive resin composition of the present invention, esters of a phenolic compound and 1,2-naphthoquinone-2-diazido-5-sulfonic acid or 1,2-naphthoquinone-2-diazido-4-sulfonic acid can be given. As specific examples, compounds shown by the following formulas (23) to (26) can be given. These compounds may be used either individually or in combination of two or more.

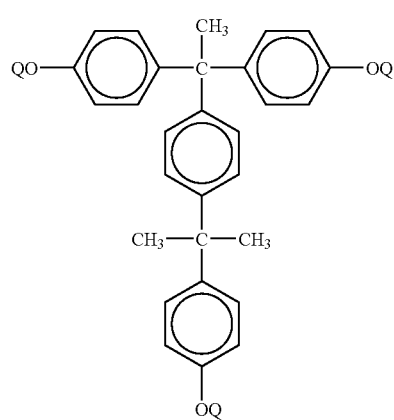

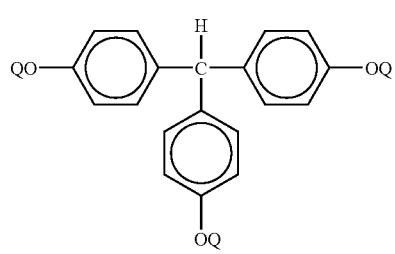

(23)

-continued
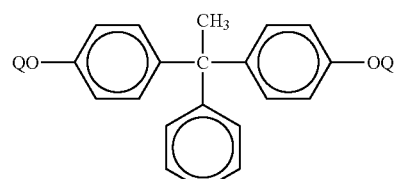
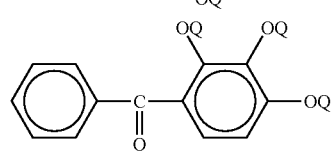
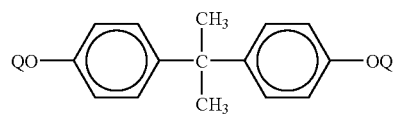
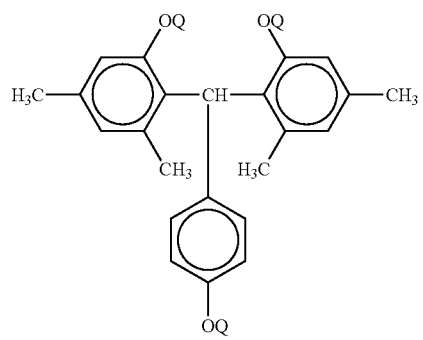
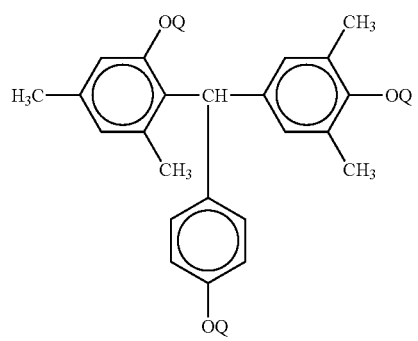
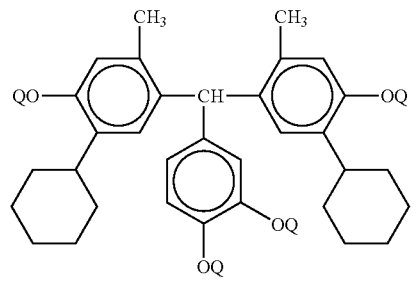
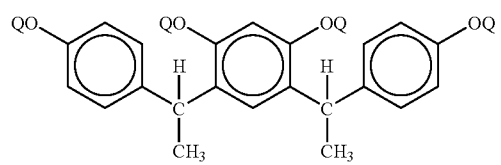
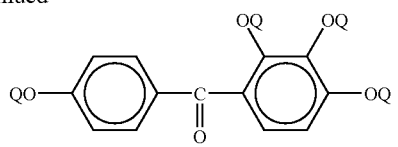
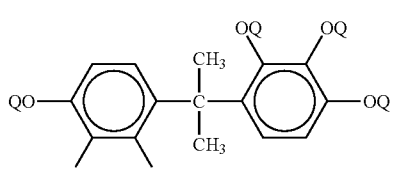
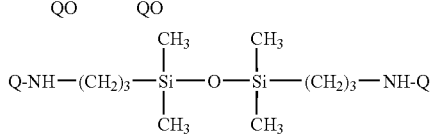
(24)
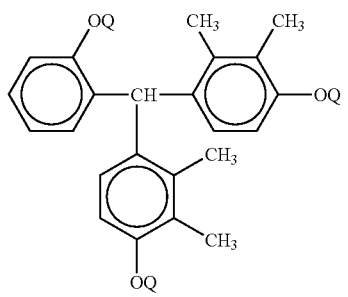
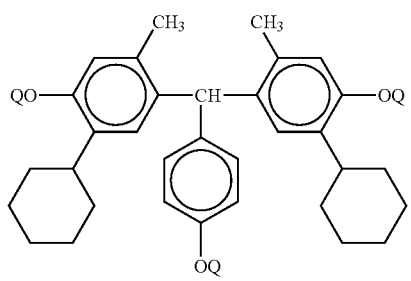
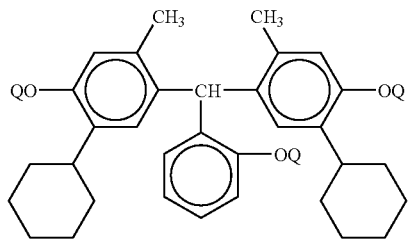
(25)
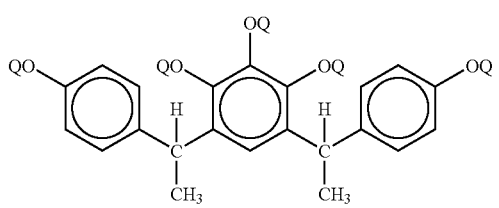

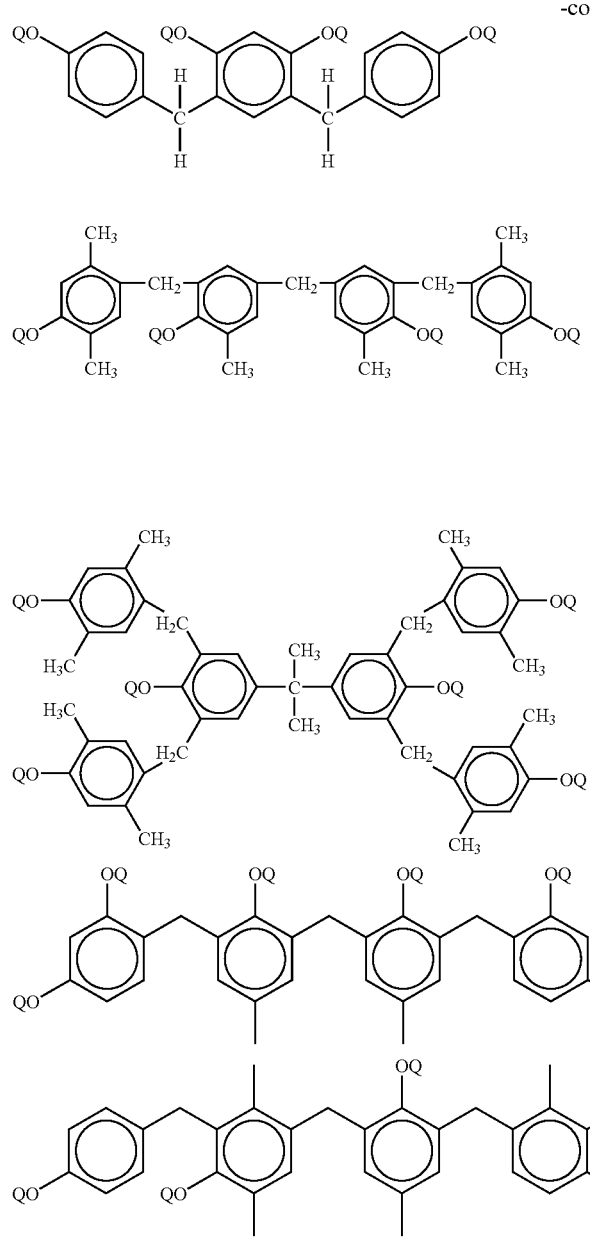
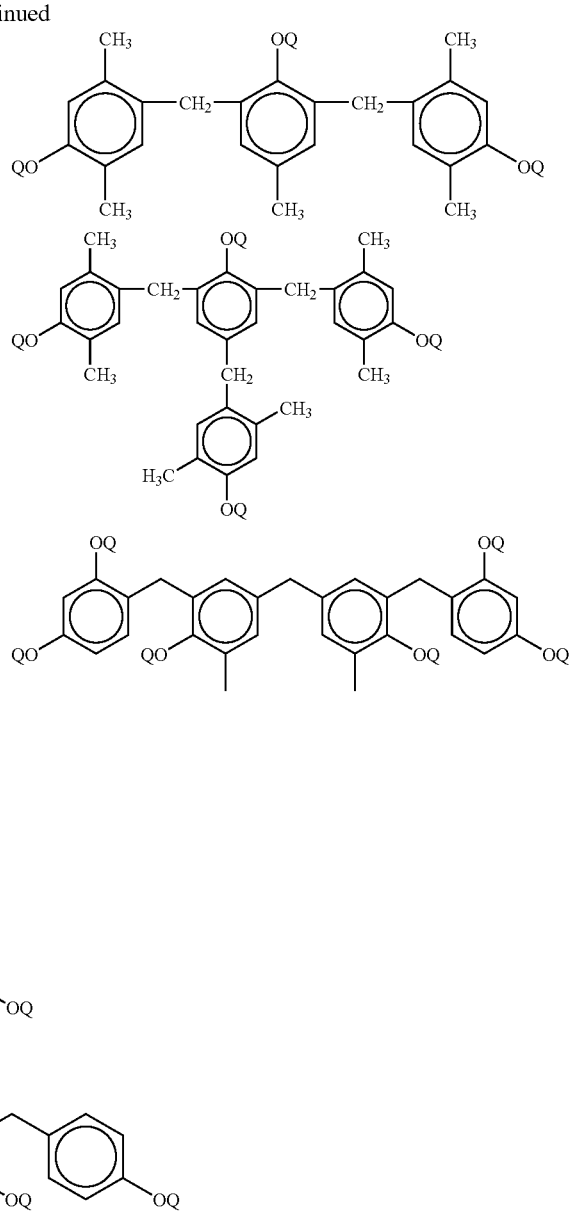
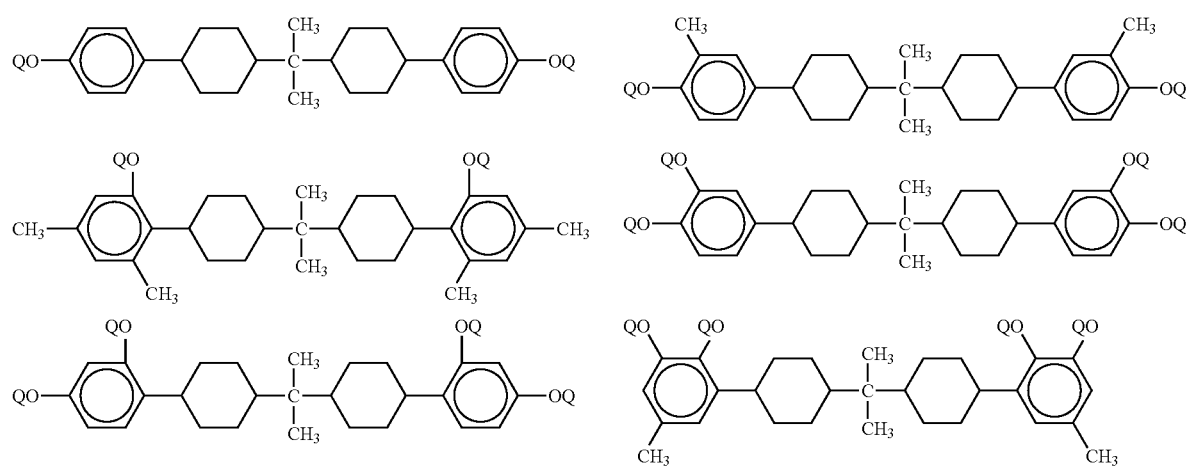
(26)

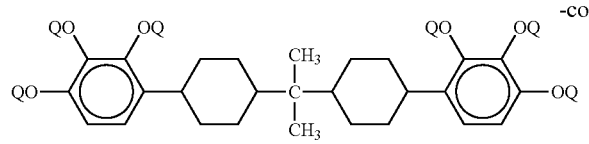
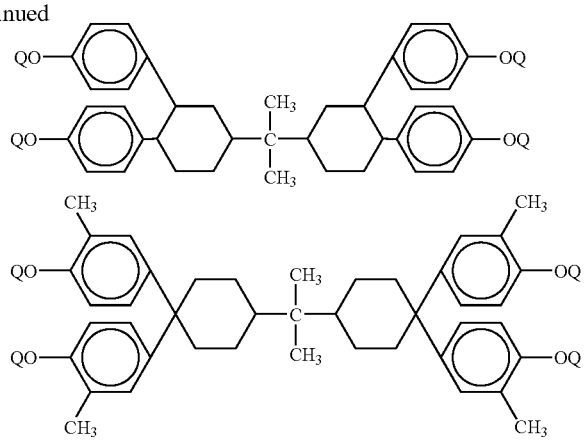
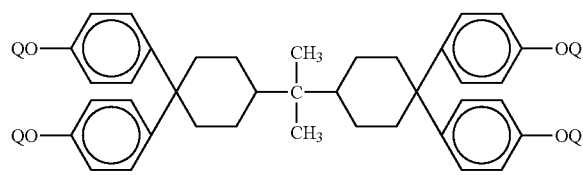

In the formulas (23) to (26), Q is selected from a hydrogen atom, the group shown by the following formula (27), and the group shown by the following formula (28). At least one of the Qs in these compounds shown by the formulas (23) to (26) is the group shown by the formula (27) or the group shown by the formula (28).

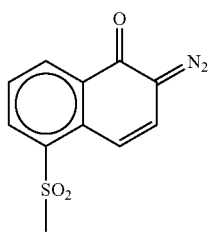

(27)

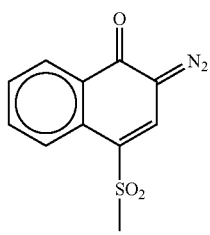

(28)

The amount of the photosensitive diazoquinone compound (B) to be added to the positive-type photosensitive resin composition of the present invention is preferably 1 to 50 parts by weight, and more preferably 10 to 40 parts by weight for 100 parts by weight of the polyamide resin (A). If the amount of the photosensitive diazoquinone compound (B) is equivalent to, or more than, the above low limit, solubility of the exposed areas in an alkaline aqueous solution increases, resulting in good patterning, high resolution, and high sensitivity. On the other hand, if the amount is equivalent to, or less than, the above upper limit, not only production of scum, but also a decrease in the transparency of the film due to the presence of the photosensitizer can be appropriately suppressed, giving rise to high resolution, and high sensitivity.

Furthermore, the positive-type photosensitive resin composition of the present invention may contain a phenol compound (C) to ensure high sensitivity and excellent patterning without producing a resinous residue (scum). Specific examples of the structure of such a phenol compound (C) include, but are not limited to, the structures shown by the following formulas (29) to (35).

(29)

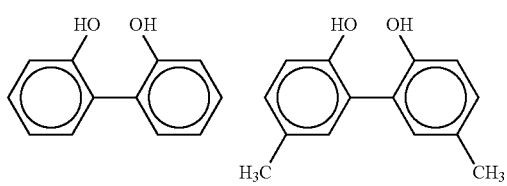
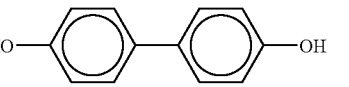
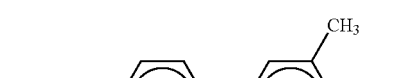
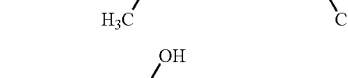
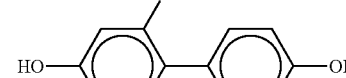
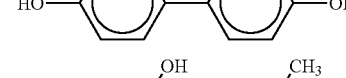
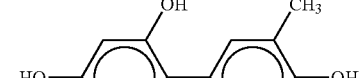
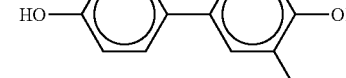
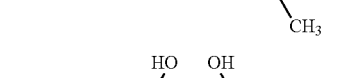
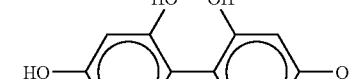

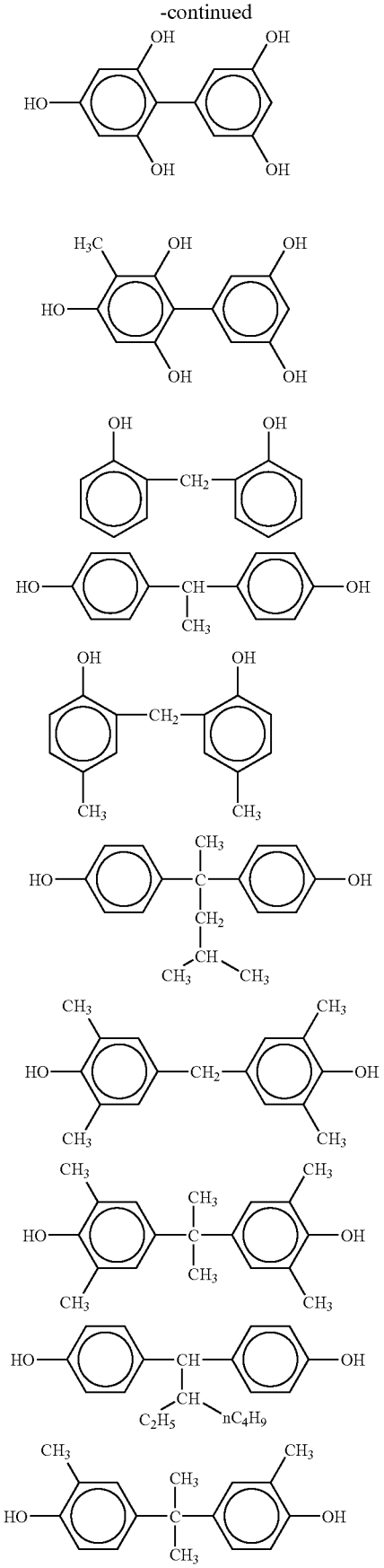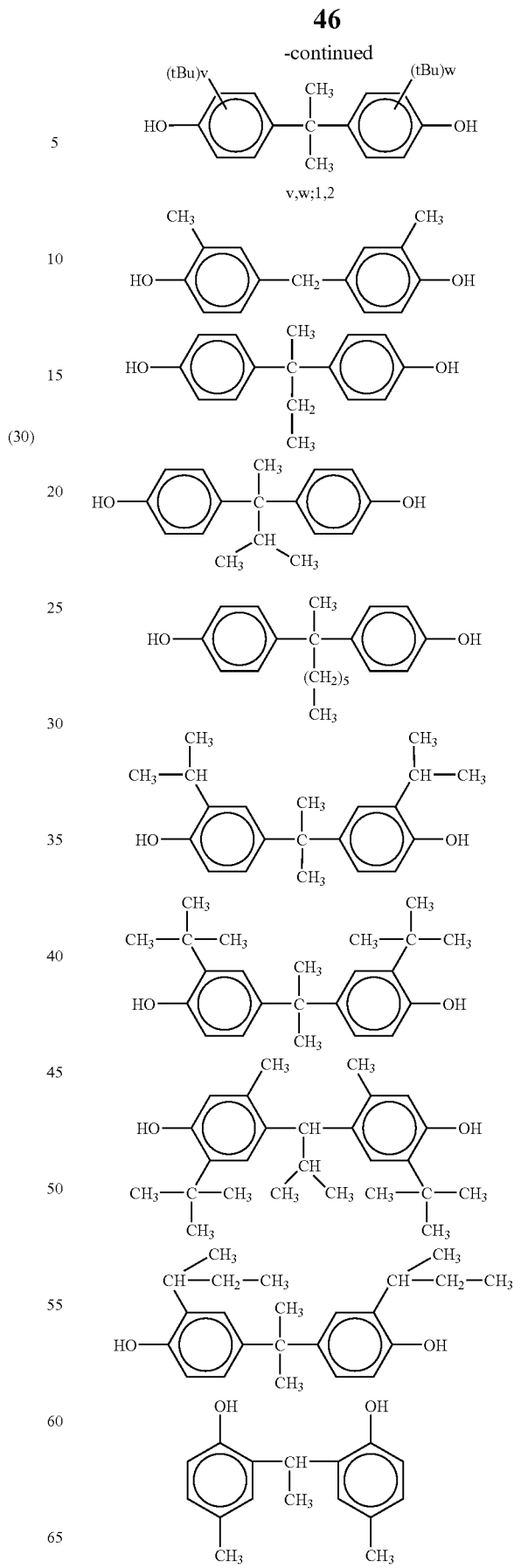

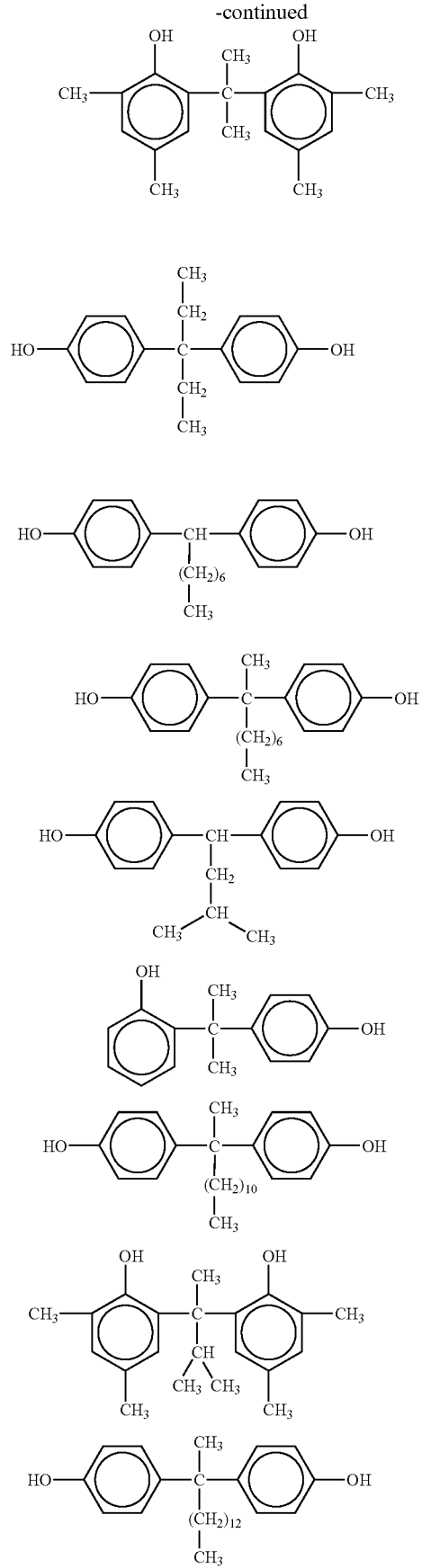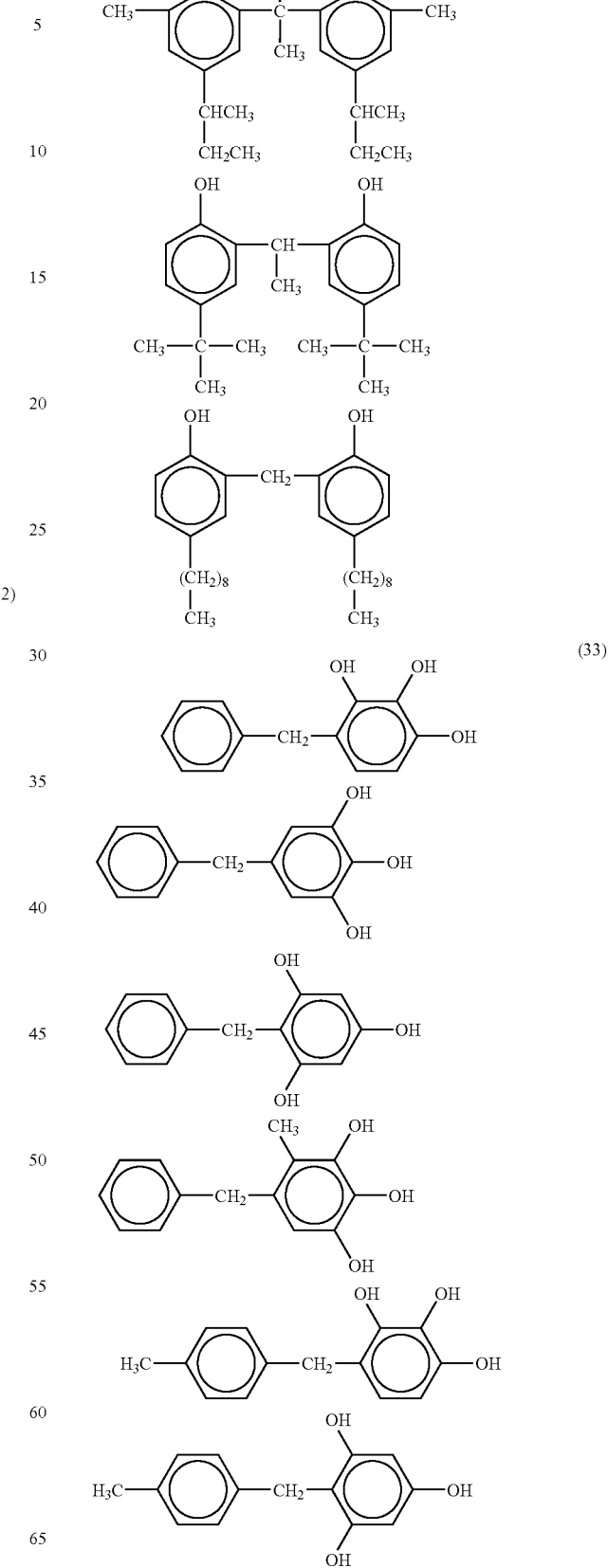

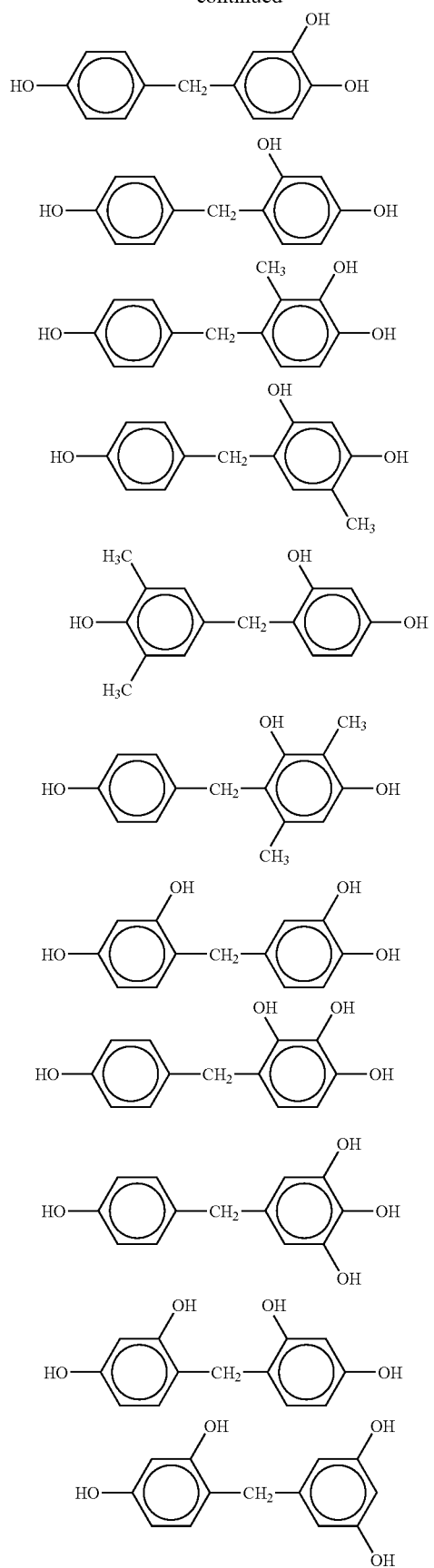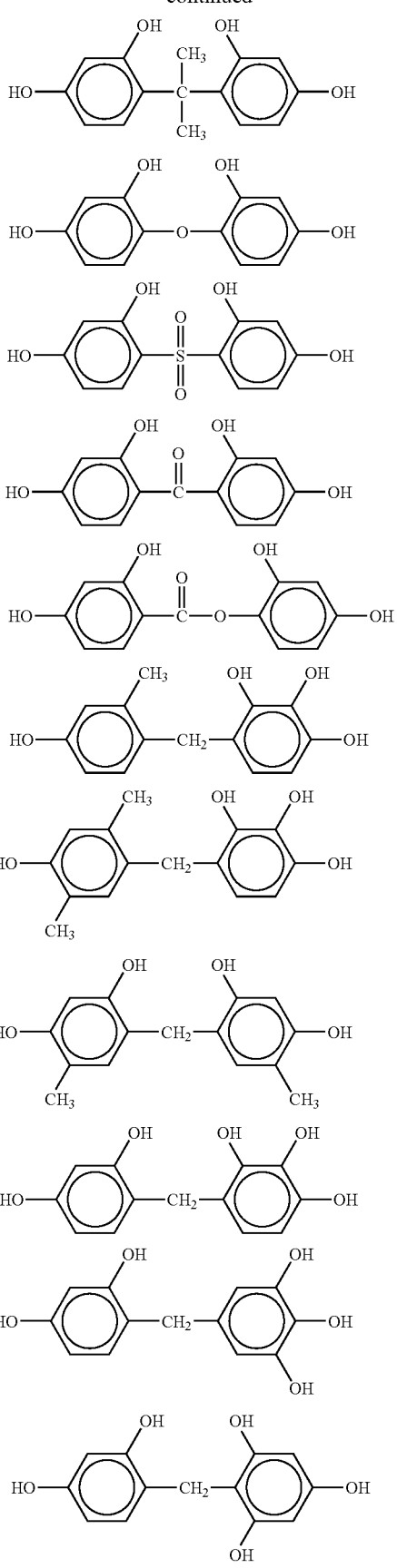

-continued

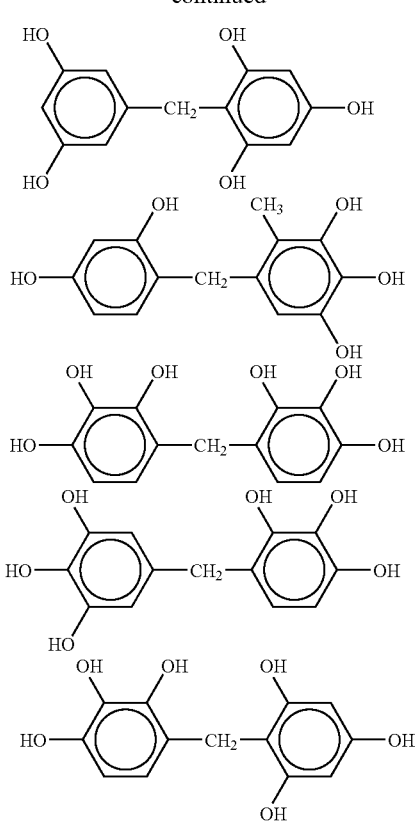

(35)

Among the phenol compounds shown by the formulas (29) to (35), the compounds shown by the following formula (36) are preferable. These compounds may be used either individually or in combination of two or more.

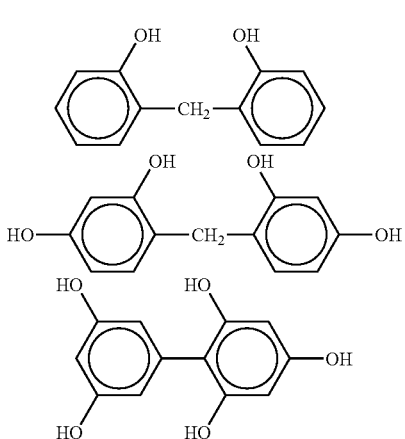

(36)

The amount of the phenol compound (C) added to the positive-type photosensitive resin composition of the present invention is preferably 1 to 30 parts by weight, and particularly preferably 1 to 25 parts by weight for 100 parts by weight of the polyamide resin (A). If the amount of the phenol compound (C) is equivalent to, or more than, the above lower limit, production of scum during development is suppressed and dissolution of the exposed area is promoted, resulting in high sensitivity. If the amount is equivalent to, or less than, the above upper limit, lowering of the residual film rate after development, decrease in resolution, and deposition during frozen storage do not occur.

The positive-type photosensitive resin composition of the present invention may further contain additives such a leveling agent, a silane coupling agent, and the like, as required.

The positive-type photosensitive resin composition of the present invention is dissolved in a solvent and used in the form of a varnish. As examples of the solvent, N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxypropionate, and the like can be given. These solvents may be used either individually or in combination of two or more.

The method of using the positive-type photosensitive resin composition of the present invention will be described below. The positive-type photosensitive resin composition of the present invention dissolved in a solvent is applied to an appropriate carrier such as a silicon wafer, a ceramic substrate, and an aluminum substrate. When applied to a semiconductor element, the composition is used in an amount to make a film with an ultimate thickness of 0.1 to 30 μm after curing. If the thickness is less than the lower limit, it may be difficult for the film to fully exhibit the function as a surface protection film of a semiconductor element. If more than the upper limit, not only is it difficult to obtain a fine processing pattern, but also processing will take a long time, resulting in a low throughput. As the method of application, spin coating using a spinner, spray coating using a spray coater, immersion, printing, roll coating, and the like can be given. The coated film is then prebaked at 60 to 130° C., dried, and irradiated with actinic rays to form a desired pattern. As the actinic rays, X rays, electron beams, ultraviolet radiation, visible radiation, and the like having a wavelength of 200 to 500 nm may be preferably used.

Next, exposed area is dissolved and removed using a developer to obtain a relief pattern. As examples of the developer, an aqueous solution of alkali compounds such as inorganic alkali compounds such as sodium hydroxide, potassium hydroxide, sodium carbonate, sodium silicate, sodium metasilicate, and ammonia water; primary amines such as ethylamine and n-propylamine; secondary amines such as diethylamine and di-n-propylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and an aqueous solution obtained by adding an appropriate amount of a water-soluble organic solvent such as an alcohol (such as methanol and ethanol) or a surfactant may be given. As the development method, spraying, paddling, immersion, supersonic waves, and the like can be used.

Next, the relief pattern formed by development is rinsed. Distilled water is used as a rinse. The resulting product is then treated with heat (cured) to form a benzoxazole ring, an imide ring, or both the benzoxazole ring and the imide ring, whereby an ultimate pattern having excellent heat resistance can be obtained.

Either heat treatment at a high temperature or a low temperature is possible. A high temperature treatment is preferably carried out at 280 to 380° C., and more preferably at 290 to 350° C. A low temperature treatment is carried out preferably at 150 to 280° C., and more preferably at 180 to 260° C.

The positive-type photosensitive resin composition of the present invention is useful not only for semiconductors, but also as an interlayer dielectric film of a multilayered circuit, a cover coat of a flexible copper-clad board, a solder resist film, and an interlayer dielectric film of the elements in a display device.

As examples of the application to semiconductor devices, a passivation layer obtained by forming a film of the positive-type photosensitive resin composition of the present invention on semiconductor elements, a buffer coat layer obtained by forming a film of the positive-type photosensitive resin composition on the passivation film which is formed on a semiconductor element, an interlayer dielectric film obtained by forming a film of the positive-type photosensitive resin composition on a circuit which is formed on a semiconductor element, and the like can be given.

As examples of the display device application, an interlayer dielectric for TFT, a TFT element planarization layer, a color-filter planarization layer, a projection for MVA liquid crystal displays, and a cathode barrier rib for organic EL elements can be given. The method of use of the composition for semiconductor devices applies to the method of use for the display elements, that is, a method of forming a patterned layer of the positive-type photosensitive resin composition on a substrate on which a display element or a color filter is formed may be used. High transparency is required particularly for an insulating layer or a planarization layer of display elements. A resin layer with such excellent transparency can be obtained by introducing a post exposure process before curing the layer of the positive-type photosensitive resin composition. Introduction of such a post exposure process is more preferable in practice.

EXAMPLES

The present invention will be described in detail below.
<Test Methods>
(1) Nuclear magnetic resonance spectrum analysis ($^1$H-NMR, $^{13}$C-NMR): measured using a JNM-GSX400 manufactured by JEOL Ltd. $^1$H-NMR was measured at a resonant frequency of 400 MHz, and $^{13}$C-NMR was measured at a resonant frequency of 100 MHz. Deuterated dimethyl sulfoxide DMSO-$d_6$ was used as a solvent.
(2) Infrared spectroscopic analysis (IR): measured by the KBr pellet method using a PARAGON 1000 manufactured by PERKIN ELMER.
(3) Mass spectrometry (MS): measured by the field desorption (FD) method using a JMS 700 manufactured by JEOL Ltd.

Example 1

Synthesis of 4,4'-methylenebis(2-nitro-3,6-dimethylphenol)

A 3000 ml four-necked separable flask equipped with a thermometer, a stirrer, a raw material inlet port, and a nitrogen gas feed pipe was charged with 2244 ml of acetic anhydride and 300.00 g (1.170 mol) of Bis 25X-F (manufactured by Honshu Chemical Industry Co., Ltd.). In a nitrogen atmosphere, 270.39 g (2.575 mol) of a 60% nitric acid aqueous solution was slowly added dropwise to the separable flask using a dropping funnel at 0 to 10° C. over one hour while stirring. After the addition, the mixture was stirred at 0 to 10° C. for a further five hours. The deposited solid was collected by suction filtration and dried under vacuum to obtain 115.72 g of a yellow solid product. As a result of analysis, the product was confirmed to be 4,4'-methylenebis(2-nitro-3,6-dimethylphenol).

Synthesis of 4,4'-methylenebis(2-amino-3,6-dimethylphenol)

A 500 ml eggplant flask equipped with a stirrer was charged with 20.00 g (0.058 mol) of the 4,4'-methylenebis(2-nitro-3,6-dimethylphenol) obtained above 200 ml of tetrahydrofuran, and 2.45 g (0.002 ml) of 10% palladium/activated carbon, and the mixture was stirred in a hydrogen atmosphere for 12 hours. The resulting solid was removed by suction filtration and the solvent in the reaction solution was evaporated under reduced pressure. After drying under vacuum, 16.54 g of a white solid was obtained. This product is referred to as (M-1).

IR analysis of the product (M-1) confirmed amino group absorptions at 3400 cm$^{-1}$, 3335 cm$^{-1}$ 1606 cm$^{-1}$, and 1576 cm$^{-1}$, $^1$H-NMR analysis confirmed chemical shifts at 1.87, 1.88, 1.93, 1.99, 2.03, 2.08, 2.19, 3.60, 4.27, 5.94, and 7.72 ppm, $^{13}$C-NMR analysis confirmed chemical shifts at 13.06, 16.68, 36.40, 118.10, 119.44, 120.97, 130.34, 135.34, and 139.69 ppm, and mass spectrometry analysis confirmed the molecular weight to be 286.4. As a result, the resulting product (M-1) was identified as the bis(aminophenol) derivative shown by the formula (4-2). The yield of the product (M-1) was 26%.

Example 2

Synthesis of Polyamide Resin

A four-necked separable flask equipped with a thermometer, a stirrer, a raw material inlet port, and a dry nitrogen gas feed pipe was charged with 40.16 g (0.090 mol) of dicarboxylic acid derivative, which was obtained by reacting 0.045 mol of isophthalic acid, 0.045 mol of diphenyl ether-4,4'-dicarboxylic acid, and 0.180 mol of 1-hydroxy-1,2,3-benzotriazole (active ester), and 28.64 g (0.100 mol) of bis(aminophenol) derivative (M-1) synthesized in Example 1.275 g of N-methyl-2-pyrrolidone was added to dissolve the mixture. The mixture was reacted at 75° C. for 16 hours using an oil bath. Next, 3.44 g (0.020 mol) of 4-ethynylphthalic anhydride dissolved in 10 g of N-methyl-2-pyrrolidone was added and the mixture was stirred for a further three hours to complete the reaction. The reaction mixture was filtered and poured into a 3:1 (volume ratio) mixture of water and methanol. The resulting precipitate collected by filtration was sufficiently washed with water and dried under vacuum to obtain the target polybenzoxazole precursor resin (A-1) of the formula (37) in which e=25, which consists of the compounds shown in Table 1.

Transmission Rate Evaluation

The composition prepared by dissolving 4.0 g of the polybenzoxazole precursor resin (A-1) in a mixed solvent of 4.0 g of N-methyl-2-pyrolidone and 4.0 g of γ-butyrolactone was applied to a quartz board using a spin coater and dried on a hot plate at 120° C. for four minutes to obtain a coated film with a thickness of 10 μm. The transmission rate of this coated film was measured with an ultraviolet/visible region spectrophotometer (manufactured by Shimadzu Corp). The transmission rate at a wavelength of 365 nm was 65%.

Synthesis of Naphthoquinone Diazido Sulfonate Compound

A four-necked separable flask equipped with a thermometer, a stirrer, a raw material inlet port, and a dry nitrogen gas feed pipe was charged with 14.01 g (0.033 mol) of a phenol compound shown by the following formula (B-1) and 9.82 g (0.097 mol) of triethylamine. 137 g of acetone was added to dissolve the mixture. After cooling the reaction mixture to 10° C. or less, 26.07 g (0.097 mol) of 1,2-naphthoquinone-2-diazido-4-sulfonylchloride was slowly added dropwise together with 100 g of acetone while maintaining the temperature at less than 10° C. After stirring for five minutes at 10° C. or less, the reaction mixture was stirred at room temperature for five hours before terminating the reaction. The reaction mixture was filtered and poured into a 3:1 (volume ratio) mixture of water and methanol. The resulting precipitate collected by filtration was sufficiently washed with water and dried under vacuum to obtain a naphthoquinone diazido sulfonate compound shown by the following formula (Q-1).
Preparation of Positive-Type Photosensitive Resin Composition 100 g of the synthesized polybenzoxazole precursor resin (A-1), and 20 g of the naphthoquinone diazido sulfonate compound which has a structure of the formula (Q-1) were dissolved in a mixed solvent of 100 g of N-methyl-2-pyrrolidone and 100 g of γ-butyrolactone. The solution was filtered through a Teflon (registered trademark) filter with a pore size of 0.2 μm to obtain a positive-type photosensitive resin composition.
Sensitivity Evaluation The positive-type photosensitive resin composition was applied to a silicon wafer using a spin coater and prebaked on a hot plate at 120° C. for three minutes to obtain a coated film with a thickness of about 7.0 μm. The coated film was exposed to radiation using an i-line stepper (4425i manufactured by NIKON Corp.) through a mask (a test chart No. 1, with or without a pattern having a width of 0.88 to 50 μm, manufactured by Toppan Printing Co., Ltd.) while changing the exposure dose. Then, the coated wafer was developed twice by a paddle method using an aqueous solution of 2.38% tetramethylammonium hydroxide for 130 seconds each time to remove the exposed areas, and washed with purified water for 10 seconds. As a result, pattern formation was confirmed at the areas irradiated at a dose of 280 mJ/cm$^2$ (sensitivity was 280 mJ/cm$^2$). The film thickness after development was 6.5 μm, which was a very large thickness.
Cyclization Evaluation The positive-type photosensitive resin composition was applied to two sheets of silicon wafers using a spin coater and prebaked on a hot plate at 120° C. for four minutes to obtain coated films, each having a thickness of about 1 μm. Next, one sheet of the silicon wafer with a coated film thereon was immersed in 2% hydrofluoric acid to obtain a prebaked film. The film was analyzed using a Fourier transform infrared spectrophotometer, PARAGON 1000 manufactured by PERKIN ELMER, to calculate the ratio (A) of the peak of the amide group at 1650 cm$^{-1}$ to the peak of the total aromatic group at 1490 cm$^{-1}$. Next, the other silicon wafer with a coated film was heated at 250° C. for 90 minutes to obtain a cured film in the same manner. The film was analyzed using a Fourier transform infrared spectrophotometer to calculate the ratio (B) of the peak of the amide group at 1650 cm$^{-1}$ to the peak of the total aromatic group at 1490 cm$^{-1}$. The cyclization rate was calculated by multiplying (1−(B/A)) by 100. The cyclization rate thus calculated was 91%.

Example 3

The reaction was carried out in the same manner as in the polyamide resin synthesis of Example 2, except for using terephthalic acid instead of the diphenyl ether 4,4'-dicarboxylic acid and changing the amount of the isophthalic acid and the terephthalic acid to respectively 0.081 mol and 0.009 mol to obtain a polybenzoxazole precursor resin (A-2) shown by the formula (37) in which e=30, which consists of the compounds shown in Table 1. Except for the above changes, the positive-type photosensitive resin composition was prepared and evaluated in the same manner as in Example 2.

Example 4

Synthesis of 4,4'-ethylidenebis(2-nitro-3,6-dimethylphenol)

A 3000 ml four-necked separable flask equipped with a thermometer, a stirrer, a raw material inlet port, and a nitrogen gas feed pipe was charged with 2244 ml of acetic anhydride and 300.00 g (1.110 mol) of 4,4'-ethylidenebis(2,5-dimethylphenol). In a nitrogen atmosphere, 256.40 g (2.441 mol) of a 60% nitric acid aqueous solution was slowly added dropwise to the separable flask using a dropping funnel at 0 to 10° C. over one hour while stirring. After the addition, the mixture was stirred at 0 to 10° C. for a further five hours. The deposited solid was collected by suction filtration and dried under vacuum to obtain 131.39 g of a yellow solid product. As a result of analysis, the product was confirmed to be 4,4'-ethylidenebis(2-nitro-3,6-dimethylphenol).

Synthesis of 4,4'-ethylidenebis(2-amino-3,6-dimethylphenol)

A 500 ml egg plant flask equipped with a stirrer was charged with 20.00 g (0.056 mol) of the 4,4'-eethylenebis(2-nitro-3,6-dimethylphenol) obtained above, 200 ml of tetrahydrofuran, and 2.35 g (0.002 mol) of 10% palladium/activated carbon, and the mixture was stirred in a hydrogen atmosphere for 12 hours. The resulting solid was removed by suction filtration and the solvent in the reaction solution was evaporated under reduced pressure. After drying under vacuum, 14.85 g of a white solid was obtained. This product is referred to as (M-2).

IR analysis of the product (M-2) confirmed amino group absorptions at 3394 cm$^{-1}$, 3370 cm$^{-1}$, and 1614 cm$^{-1}$, $^1$H-NMR analysis confirmed chemical shifts at 1.27, 1.29, 1.88, 2.02, 4.11, 4.12, 4.14, 4.19, 6.07, and 7.67 ppm, $^{13}$C-NMR analysis confirmed chemical shifts at 12.44, 16.89, 21.89, 36.45, 116.90, 117.55, 120.73, 135.16, 136.20, and 139.49 ppm, and the mass spectrometry analysis confirmed the molecular weight to be 300.4. As a result, the resulting product (M-2) was identified to be a bis(aminophenol) derivative shown by the formula (5-3). The yield of the product (M-2) was 32%.

Example 5

The reaction was carried out in the same manner as in the polyamide resin synthesis of Example 2, except for changing the amount of the isophthalic acid and the diphenyl ether-4,4'-dicarboxylic acid to respectively 0.344 mol and 0.516 mol, and using 300.40 g (1.000 mol) of the bis(aminophenol) derivative (M-2) instead of the bis(aminophenol) derivative (M-1) to obtain a polybenzoxazole precursor resin (A-3) shown by the formula (37) in which e=21, which consists of the compounds shown in Table 1. Except for the above changes, the positive-type photosensitive resin composition was prepared and evaluated in the same manner as in Example 2.

Example 6

Synthesis of 4,4'-ethylidenebis(2-nitro-3-methyl-6-cyclohexylphenol)

A 3000 ml four-necked separable flask equipped with a thermometer, a stirrer, a raw material inlet port, and a nitrogen gas feed pipe was charged with 2244 ml of acetic anhydride and 300.00 g (0.738 mol) of 4,4'-ethylidenebis(2-cyclohexyl-5-methylphenol). In a nitrogen atmosphere, 170.50 g (1.623 mol) of a 60% nitric acid aqueous solution was slowly added dropwise to the separable flask using a dropping funnel at 0 to 10° C. over one hour while stirring. After the addition, the mixture was stirred at 0 to 10° C. for a further five hours. The deposited solid was collected by suction filtration and dried under vacuum to obtain 85.27 g of a yellow solid product. As a result of analysis, the product was confirmed to be 4,4'-ethylidenebis(2-nitro-3-methyl-6-cyclohexylphenol).

Synthesis of 4,4'-ethylidenebis(2-amino-3-methyl-6-cyclohexylphenol)

A 500 ml egg plant flask equipped with a stirrer was charged with 20.00 g (0.040 mol) of the 4,4'-eethylenebis(2-nitro-3-methyl-6-cyclohexylphenol) obtained above, 200 ml of tetrahydrofuran, and 1.71 g (0.002 mol) of 10% palladium/activated carbon, and the mixture was stirred in a hydrogen atmosphere for 12 hours. The resulting solid was removed by suction filtration and the solvent in the reaction solution was evaporated under reduced pressure. After drying under vacuum, 10.87 g of a white solid was obtained. This product is referred to as (M-3).

IR analysis of the product (M-3) confirmed amino group absorptions at 3418 cm$^{-1}$, 3386 cm$^{-1}$, and 1614 cm$^{-1}$, $^1$H-NMR analysis confirmed chemical shifts at 1.12, 1.13, 1.14, 1.15, 1.18, 1.21, 1.24, 1.28, 1.30, 1.34, 1.36, 1.57, 1.60, 1.66, 1.69, 1.74, 1.75, 1.92, 2.77, 2.80, 2.83, 4.17, 4.18, 4.20, 4.22, 6.28 and 7.49 ppm, $^{13}$C-NMR analysis confirmed chemical shifts at 12.43, 22.39, 26.05, 26.67, 33.30, 33.41, 36.25, 36.41, 113.12, 117.09, 131.17, 135.10, 136.24, and 138.00 ppm, and the mass spectrometry analysis confirmed the molecular weight to be 436.7. As a result, the resulting product (M-3) was identified to be a bis(aminophenol) derivative shown by the formula (9-11). The yield of the product (M-3) was 32%.

Example 7

The reaction was carried out in the same manner as in the polyamide resin synthesis of Example 5, except for using 436.64 g (1.000 mol) of the bis(aminophenol) derivative (M-3) instead of the bis(aminophenol) derivative (M-2) to obtain the target polybenzoxazole precursor resin (A-4) shown by the formula (37) in which e=15, which consists of the compounds shown in Table 1. Except for the above changes, the positive-type photosensitive resin composition was prepared and evaluated in the same manner as in Example 2.

The structures of B-1 and Q-1 of the examples and Table 1 are shown below.

B-1:

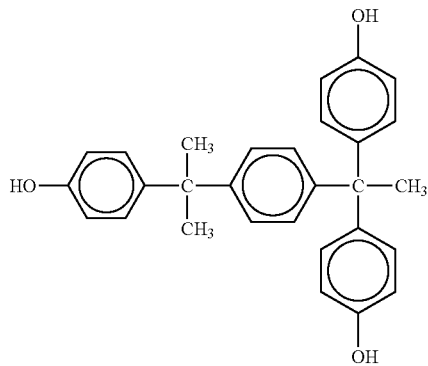

Q-1:

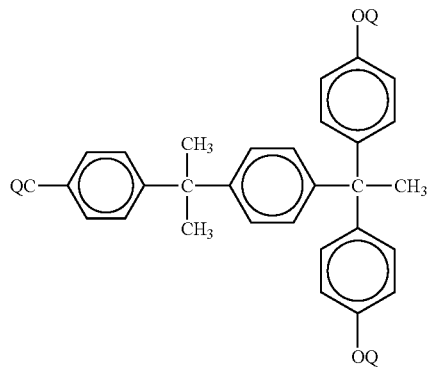

wherein Q is a hydrogen atom or a group shown by the following formula, 93% of Q being the group shown by the following formula.

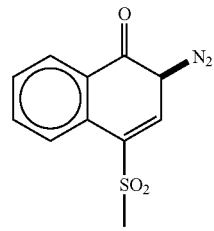

TABLE 1

| | | | | Properties | | |
|---|---|---|---|---|---|---|
| | Component and amount Polyamide resin (A) (100 g) | | Photosensitive diazoquinone compound (B) | Transmission rate | Sensitivity | Cyclization rate |
| | Amine (molar ratio) | Acid (molar ratio) | (g) | (%) | (mJ/cm$^2$) | (%) |
| Example 2 | 4,4'-methylenebis(2-amino-3,6-dimethylphenol) (1.00) | Isophthalic acid (0.45) Diphenylether-4,4'-dicarboxylic acid (0.45) | Q-1 20 | 65 | 280 | 91 |

TABLE 1-continued

|  | Component and amount Polyamide resin (A) (100 g) | | Properties | | | |
|---|---|---|---|---|---|---|
|  |  |  | Photosensitive diazoquinone compound (B) (g) | Transmission rate (%) | Sensitivity (mJ/cm²) | Cyclization rate (%) |
|  | Amine (molar ratio) | Acid (molar ratio) |  |  |  |  |
| Example 3 | 4,4'-methylenebis(2-amino-3,6-dimethylphenol) (1.00) | Isophthalic acid (0.81) Terephthalic acid (0.09) | Q-1 20 | 70 | 250 | 96 |
| Example 5 | 4,4'-ethylidenebis(2-amino-3,6-dimethylphenol) (1.00) | Isophthalic acid (0.34) Diphenylether-4,4'-dicarboxylic acid (0.52) | Q-1 20 | 62 | 310 | 95 |
| Example 7 | 4,4'-ethylidenebis(2-amino-3-methyl-6-cyclohexylphenol) (1.00) | Isophthalic acid (0.34) Diphenylether-4,4'-dicarboxylic acid (0.52) | Q-1 20 | 53 | 350 | 87 |

As shown in Table 1, the polyamide resins of Examples 2, 3, 5, and 7 had high transparency and high sensitivity, and exhibited a high cyclization rate when cured at a low temperature of 250° C.

Example 8

Synthesis of Polyamide Resin

A four-necked separable flask equipped with a thermometer, a stirrer, a raw material inlet port, and a dry nitrogen gas feed pipe was charged with 409.94 g (0.900 mol) of dicarboxylic acid derivative (active ester), which was obtained by reacting 0.360 mol of isophthalic acid, 0.540 mol of diphenyl ether-4,4'-dicarboxylic acid, and 1.800 mol of 1-hydroxy-1,2,3-benzotriazole, and 286.37 g (1.000 mol) of 4,4'-methylenebis(2-amino-3,6-dimethylphenol). 2950 g of N-methyl-2-pyrrolidone was added to dissolve the mixture. The mixture was reacted at 75° C. for 12 hours using an oil bath.

Next, 34.43 g (0.200 mol) of 4-ethynylphthalic anhydride dissolved in 100 g of N-methyl-2-pyrrolidone was added and the mixture was stirred for a further 12 hours to complete the reaction. The reaction mixture was filtered and poured into a 3:1 (volume ratio) mixture of water and methanol. The resulting precipitate collected by filtration was sufficiently washed with water and dried under vacuum to obtain the target polyamide resin (A-8) in which the units of the formulas (114-1), (14-2), and (14-3) were randomly copolymerized at a ratio satisfying the equations $\{c/(c+d)\} \times 100 = 100$ and $\{d/(c+d)\} \times 100 = 0$. The number average molecular weight of the polyamide resin (A-8) was 12,000 and the resin consisted of the compounds shown in Table 2.

Transmission Rate Evaluation

A solution prepared by dissolving 4.0 g of the polyamide resin (A-8) in 8.0 g of γ-butyrolactone was applied to a quartz board using a spin coater and dried on a hot plate at 120° C. for four minutes to obtain a coated film with a thickness of 10 μm. The transmission rate of this coated film was measured with an ultraviolet/visible region spectrophotometer (manufactured by Shimadzu Corp). The transmission rate at a wavelength of 365 nm was 67%.

Synthesis of Naphthoquinone Diazido Sulfonate Compound

A four-necked separable flask equipped with a thermometer, a stirrer, a raw material inlet port, and a dry nitrogen gas feed pipe was charged with 15.82 g (0.025 mol) of a phenol compound shown by the formula (B-2) and 8.40 g (0.083 mol) of triethylamine. 135 g of tetrahydrofuran was added to dissolve the mixture. After cooling the reaction mixture to 10° C. or less, 22.30 g (0.083 mol) of 1,2-naphthoquinone-2-diazido-4-sulfonylchloride was slowly added dropwise together with 100 g of tetrahydrofuran while maintaining the temperature at less than 10° C. After stirring for five minutes at 10° C. or less, the reaction mixture was stirred at room temperature for five hours before terminating the reaction. The reaction mixture was filtered and poured into a 3:1 (volume ratio) mixture of water and methanol. The resulting precipitate collected by filtration was sufficiently washed with water and dried under vacuum to obtain a naphthoquinone diazido sulfonate compound shown by the following formula (Q-2).

Preparation of Positive-Type Photosensitive Resin Composition 100 g of the synthesized polyamide resin (A-8), 15 g of the naphthoquinone diazido sulfonate compound, which has a structure of the following formula (Q-2), were dissolved in 200 g of N-methyl-2-pyrrolidone. The solution was filtered through a fluororesin filter with a pore size of 0.2 μm to obtain a positive-type photosensitive resin composition.

Sensitivity Evaluation

The positive-type photosensitive resin composition was applied to a silicon wafer using a spin coater and prebaked on a hot plate at 120° C. for three minutes to obtain a coated film with a thickness of about 8.1 μm. The coated film was exposed to radiation using an i-line stepper (4425i manufactured by NIKON Corp.) through a mask (test chart No. 1, with or without a pattern having a width of 0.88 to 50 μm, manufactured by Toppan Printing Co., Ltd.) while changing the exposure dose.

Then, the coated wafer was developed twice by a paddle method using an aqueous solution of 2.38% tetramethylammonium hydroxide for 150 seconds each time to remove the exposed areas and washed with purified water for 10 seconds. As a result, pattern formation was confirmed at the areas irradiated at a dose of 260 mJ/cm² (sensitivity was 260 mJ/cm²). The film thickness after development was 8.0 μm, which was a very large thickness.

Cyclization Rate Evaluation

The positive-type photosensitive resin composition was applied to two sheets of silicon wafers using a spin coater and prebaked on a hot plate at 120° C. for four minutes to obtain coated films, each having a thickness of about 1 μm. Next, one sheet of the silicon wafer with a coated film thereon was immersed in a 2% hydrofluoric acid to obtain a prebaked film. The film was analyzed using a Fourier transform infrared spectrophotometer, PARAGON 1000 (manufactured by PERKINELMER), to calculate the ratio (A) of the peak of the amide group at 1650 cm$^{-1}$ to the peak of the total aromatic groups at 1490 cm$^{-1}$. Next, the other silicon wafer with a coated film was heated in an oven at 250° C. for 90 minutes to obtain a cured film in the same manner. The film was analyzed using a Fourier transform infrared spectrophotometer to calculate the ratio (B) of the peak of the amide group at 1650 cm$^{-1}$ to the peak of the total aromatic groups at 1490 cm$^{-1}$. The cyclization rate was calculated by multiplying (1−(B/A)) by 100. The cyclization rate thus calculated was 95%.

Evaluation of Water Absorption

The positive-type photosensitive resin composition was applied to a 6-inch silicon wafer using a spin coater and prebaked on a hot plate at 120° C. for four minutes to obtain a coated film with a thickness of about 10 μm. The silicon wafer with the coated film thereon was heated in an oven at 250° C. for 90 minutes. After curing, the coated film was cut to produce a 5 cm×5 cm square, which was immersed in a 2% hydrofluoric acid solution. The water absorption of the film was measured according to JIS-K7209 and found to be 0.65%.

Example 9

The reaction was carried out in the same manner as in Example 8, except for changing the amount of isophthalic acid and diphenyl ether-4,4'-dicarboxylic acid respectively to 0.200 mol and 0.700 mol, reducing the amount of 4,4'-methylenebis (2-amino-3,6-dimethylphenol) to 214.78 g (0.750 mol) and using 70.08 g (0.250 mol) of 3,3'-diamino-4,4'-dihydroxydiphenylsulfone to replace the remainder to obtain a polyamide resin (A-9) in which the units of the formulas (14-1), (14-2), and (14-3) are randomly copolymerized at a ratio satisfying the equations {c/(c+d)}×100=75 and {d/(c+d)}×100=25. The number average molecular weight of the polyamide resin (A-9) was 13,000 and the resin consisted of the compounds shown in Table 2. Except for the above changes, the positive-type photosensitive resin composition was prepared and evaluated in the same manner as in Example 8.

Example 10

The reaction was carried out in the same manner as in Example 8, except for omitting the use of isophthalic acid and instead increasing the amount of diphenyl ether-4,4'-dicarboxylic acid to 0.900 mol, reducing the amount of 4,4'-methylenebis (2-amino-3,6-dimethylphenol) to 114.55 g (0.400 mol) and using 219.76 g (0.600 mol) of hexafluoro-2,2-bis (3-amino-4-hydroxyphenyl)propane to replace the remainder to obtain a polyamide resin (A-10) in which the units of the formulas (14-1), (14-2), and (14-3) are randomly copolymerized at a ratio satisfying the equations {c/(c+d)}×100=40 and {d/(c+d)}×100=60. The number average molecular weight of the polyamide resin (A-10) was 13,000 and the resin consisted of the compounds shown in Table 2. Except for the above changes, the positive-type photosensitive resin composition was prepared and evaluated in the same manner as in Example 8.

Example 11

The reaction was carried out in the same manner as in Example 8, except for changing the amount of isophthalic acid and diphenyl ether-4,4'-dicarboxylic acid respectively to 0.340 mol and 0.510 mol, reducing the amount of 4,4'-methylenebis(2-amino-3,6-dimethylphenol) to 200.46 g (0.700 mol) and instead using 69.08 g (0.300 mol) of 3,3'-diamino-4,4'-dihydroxydiphenylmethane, and changing the amount of 4-ethynylphthalic anhydride to 51.64 g (0.300 mol) to obtain a polyamide resin (A-11) in which the units of the formulas (14-1), (14-2), and (14-3) are randomly copolymerized at a ratio satisfying the equations {c/(c+d)}×100=70 and {d/(c+d)}×100=30. The number average molecular weight of the polyamide resin (A-11) was 9100 and the resin consisted of the compounds shown in Table 2. Except for the above changes, the positive-type photosensitive resin composition was prepared and evaluated in the same manner as in Example 8.

Example 12

The reaction was carried out in the same manner as in Example 11, except for using 77.50 g (0.300 mol) of 2,2-bis (3-amino-4-hydroxyphenyl)propane instead of 3,3'-diamino-4,4'-dihydroxydiphenylmethane to obtain a polyamide resin (A-12) in which the units of the formulas (14-1), (14-2), and (14-3) are randomly copolymerized at a ratio satisfying the equations {c/(c+d)}×100=70 and {d/(c+d)}×100=30. The number average molecular weight of the polyamide resin (A-12) was 9400 and the resin consisted of the compounds shown in Table 2. Except for the above changes, the positive-type photosensitive resin composition was prepared and evaluated in the same manner as in Example 8.

Example 13

The reaction was carried out in the same manner as in Example 8, except for changing the amount of isophthalic acid and diphenyl ether-4,4'-dicarboxylic acid respectively to 0.344 mol and 0.516 mol, using 300.40 g (1.000 mol) of 4,4'-ethylidenebis(2-amino-3,6-dimethylphenol) instead of 4,4'-methylenebis(2-amino-3,6-dimethylphenol), and changing the amount of 4-ethynylphthalic anhydride to 48.20 g (0.280 mol) to obtain a polyamide resin (A-13) in which the units of the formulas (14-1), (14-2), and (14-3) are randomly copolymerized at a ratio satisfying the equations {c/(c+d)}×100=100 and {d/(c+d)}×100=0. The number average molecular weight of the polyamide resin (A-11) was 10,200 and the resin consisted of the compounds shown in Table 2. Except for the above changes, the positive-type photosensitive resin composition was prepared and evaluated in the same manner as in Example 8.

Example 14

The reaction was carried out in the same manner as in Example 13, except for changing the amount of isophthalic acid and diphenyl ether-4,4'-dicarboxylic acid respectively to 0.252 mol and 0.588 mol, reducing the amount of 4,4'-ethylenebis(2-amino-3,6-dimethylphenol) to 210.28 g (0.700 mol) and using 69.08 g (0.300 mol) of 3,3'-diamino-4,4'-dihydroxydiphenylmethane to replace the remainder, and changing the amount of 4-ethynylphthalic anhydride to 55.08 g (0.320 mol) to obtain a polyamide resin (A-14) in which the units of the formulas (14-1), (14-2), and (14-3) are randomly copolymerized at a ratio satisfying the equations {c/(c+d)}×100=70 and {d/(c+d)}×100=30. The number average molecular weight of the polyamide resin (A-14) was 9500 and the resin consisted of the compounds shown in Table 2. Except for the above changes, the positive-type photosensitive resin composition was prepared and evaluated in the same manner as in Example 8.

Example 15

The reaction was carried out in the same manner as in Example 14, except for using 77.50 g (0.300 mol) of 2,2-bis (3-amino-4-hydroxyphenyl)propane instead of 3,3'-diamino-4,4'-dihydroxydiphenylmethane to obtain a polyamide resin (A-15) in which the units of the formulas (14-1), (14-2), and (14-3) are randomly copolymerized at a ratio satisfying the equations {c/(c+d)}×100=70 and {d/(c+d)}×100=30. The number average molecular weight of the polyamide resin (A-15) was 9600 and the resin consisted of the compounds shown in Table 2. Except for the above changes, the positive-type photosensitive resin composition was prepared and evaluated in the same manner as in Example 8.

Example 16

The reaction was carried out in the same manner as in Example 13, except for using 436.64 g (1.000 mol) of 4,4'-ethylidenebis(2-amino-3-methyl-6-cyclohexylphenol) instead of 4,4'-ethylidenebis(2-amino-3,6-dimethylphenol) to obtain a polyamide resin (A-16) in which the units of the formulas (14-1), (14-2), and (14-3) are randomly copolymerized at a ratio satisfying the equations {c/(c+d)}×100=100 and {d/(c+d)}×100=0. The number average molecular weight of the polyamide resin (A-16) was 9200 and the resin consisted of the compounds shown in Table 2. Except for the above changes, the positive-type photosensitive resin composition was prepared and evaluated in the same manner as in Example 8.

Comparative Example 1

Synthesis of Polyamide Resin

A four-necked separable flask equipped with a thermometer, a stirrer, a raw material inlet port, and a dry nitrogen gas feed pipe was charged with 443.21 g (0.900 mol) of a dicarboxylic acid derivative (active ester), which was obtained by reacting 0.900 mol of diphenyl ether 4,4'-dicarboxylic acid and 1.800 mol of 1-hydroxy-1,2,3-benzotriazole, and 366.26 g (1.000 mol) of hexafluoro-2,2-bis(3-amino-4-hydroxyphenyl)propane. 3200 g of N-methyl-2-pyrrolidone was added to dissolve the mixture. The mixture was reacted at 75° C. for 12 hours using an oil bath.

Next, 34.43 g (0.200 mol) of 4-ethynylphthalic anhydride dissolved in 100 g of N-methyl-2-pyrrolidone was added and the mixture was stirred for a further 12 hours to complete the reaction. The reaction mixture was filtered and poured into a 3:1 (volume ratio) mixture of water and methanol. The resulting precipitate collected by filtration was sufficiently washed with water and dried under vacuum to obtain the target polyamide resin (A-17) in which the units of the formulas (14-1), (14-2), and (14-3) are randomly copolymerized at a ratio satisfying the equations {c/(c+d)}×100=0 and {d/(c+d)}×100=100. The number average molecular weight of the polyamide resin (A-17) was 12,000 and the resin consisted of the compounds shown in Table 2. Except for the above changes, the positive-type photosensitive resin composition was prepared and evaluated in the same manner as in Example 8.

Comparative Example 2

The reaction was carried out in the same manner as in Example 9, except for using 232.25 g (1.000 mol) of 3,3'-diamine-4,4'-dihydroxydiphenylether instead of 4,4'-methylenebis(2-amino-3,6-dimethylphenol) and 3,3'-diamino-4,4'-dihydroxydiphenylsulfone to obtain a polyamide resin (A-18) in which the units of the formulas (14-1), (14-2), and (14-3) are randomly copolymerized at a ratio satisfying the equations {c/(c+d)}×100=0 and {d/(c+d)}×100=100. The number average molecular weight of the polyamide resin (A-18) was 11,000 and the resin consisted of the compounds shown in Table 2. Except for the above changes, the positive-type photosensitive resin composition was prepared and evaluated in the same manner as in Example 8.

Comparative Example 3

The reaction was carried out in the same manner as in Comparative Example 1, except for changing the mol ratio of diphenyl ether-4,4'-dicarboxylic acid to 0.880 mol and using 258.32 g (1.000 mol) of 2,2-bis(3-amino-4-hydroxyphenyl)propane instead of hexafluoro-2,2-bis(3-amino-4-hydroxyphenyl)propane to obtain a polyamide resin (A-19) in which the units of the formulas (14-1), (14-2), and (14-3) are randomly copolymerized at a ratio satisfying the equations {c/(c+d)}×100=0 and {d/(c+d)}×100=100. The number average molecular weight of the polyamide resin (A-19) was 10,000 and the resin consisted of the compounds shown in Table 2. Except for the above changes, the positive-type photosensitive resin composition was prepared and evaluated in the same manner as in Example 8.

The structures of B-2 and Q-2 of the Examples and Comparative Examples and Table 2 are shown below,

B-2:

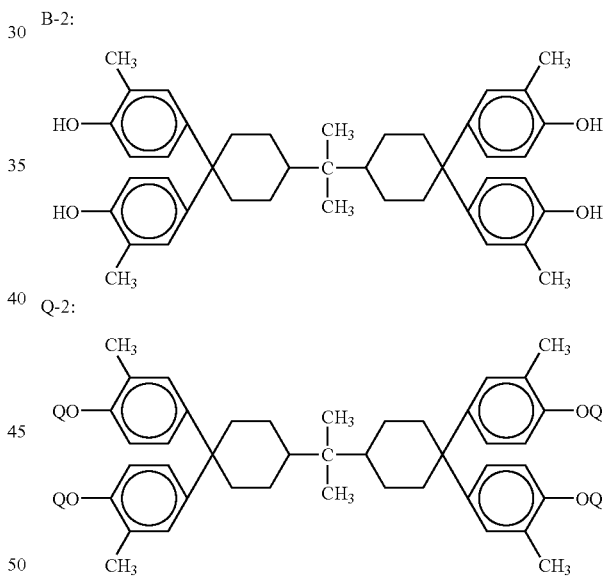

Q-2:

wherein Q is a hydrogen atom or a group shown by the following formula, 85% of Q being the group shown by the following formula.

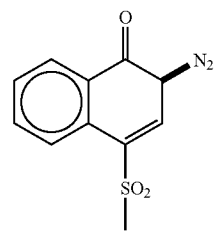

TABLE 2

| | Component and amount Polyamide resin (A) (100 g) | | Photosensitive diazoquinone compound (B) (g) | Properties | | | |
|---|---|---|---|---|---|---|---|
| | | | | Transmission rate (%) | Sensitivity (mJ/cm$^2$) | Cyclization rate (%) | Water absorption rate (%) |
| | Amine (molar ratio) | Acid (molar ratio) | | | | | |
| Example 8 | 4,4'-methylenebis(2-amino-3,6-dimethylphenol) (1.00) | Isophthalic acid (0.36) Diphenylether-4,4'-dicarboxylic acid (0.54) | Q-2 15 | 67 | 260 | 95 | 0.65 |
| Example 9 | 4,4'-methylenebis(2-amino-3,6-dimethylphenol) (0.75) 3,3'-diamino-4,4'-dihydroxy-diphenylsulfone (0.25) | Isophthalic acid (0.20) Diphenylether-4,4'-dicarboxylic acid (0.70) | Q-2 15 | 67 | 240 | 90 | 0.71 |
| Example 10 | 4,4'-methylidenebis(2-amino-3,6-dimethylphenol) (0.40) hexafluoro-2,2-bis(3-amino-4-hydroxyphenyl)propane (0.60) | Diphenylether-4,4'-dicarboxylic acid (0.90) | Q-2 15 | 69 | 220 | 86 | 0.80 |
| Example 11 | 4,4'-methylenebis(2-amino-3,6-dimethylphenol) (0.70) 3,3'-diamino-4,4'-dihydroxy-diphenylmethane (0.30) | Isophthalic acid (0.34) Diphenylether-4,4'-dicarboxylic acid (0.51) | Q-2 15 | 48 | 270 | 91 | 0.71 |
| Example 12 | 4,4'-methylenebis(2-amino-3,6-dimethylphenol) (0.70) 2,2-bis(3-amino-4-hydroxyphenyl) propane (0.30) | Isophthalic acid (0.34) diphenylether-4,4'-dicarboxylic acid (0.51) | Q-2 15 | 43 | 280 | 92 | 0.77 |
| Example 13 | 4,4'-ethylidenebis(2-amino-3,6-dimethlyphenol) (1.00) | Isophthalic acid (0.34) Diphenylether-4,4'-dicarboxylic acid (0.52) | Q-2 15 | 62 | 280 | 95 | 0.60 |
| Example 14 | 4,4'-ethylidenebis(2-amino-3,6-dimethylphenol) (0.70) 3,3'-diamino-4,4'-dihydroxy-diphenylmethane (0.30) | Isophthalic acid (0.25) Diphenylether-4,4'-dicarboxylic acid (0.59) | Q-2 15 | 49 | 300 | 91 | 0.64 |
| Example 15 | 4,4'-ethylidenebis(2-amino-3,6-dimethylphenol) (0.70) 2,2-bis(3-amino-4-hydroxyphenyl) propane (0.30) | Isophthalic acid (0.25) Diphenylether-4,4'-dicarboxylic acid (0.59) | Q-2 15 | 47 | 300 | 90 | 0.73 |
| Example 16 | 4,4'-ethylidenebis(2-amino-3-methyl-6-cyclohexylphenol) (1.00) | Isophthalic acid (0.34) Diphenylether-4,4'-dicarboxylic acid (0.52) | Q-2 15 | 53 | 330 | 88 | 0.69 |
| Example 17 | 4,4'-methylenebis(2-amino-3,6-dimethylphenol) (1.00) | Diphenylether-4,4'-dicarboxylic acid (0.69) 4,4'-oxydiphathalic anhydride (0.17) | Q-2 15 | 55 | 270 | 92 | 0.77 |
| Example 18 | 4,4'-methylenebis(2-amino-3,6-dimethylphenol) (0.80) 4,4'-diaminodiphenylmethane (0.20) | Diphenylether-4,4'-dicarboxylic acid (0.45) 4,4'-oxydiphathalic anhydride (0.45) | Q1 25 | 64 | 320 | 88 | 0.86 |
| Comparative Example 1 | hexafluoro-2,2-bis(3-amino-4-hydroxyphenyl) propane (1.00) | Diphenylether-4,4'-dicarboxylic acid (0.90) | Q-2 15 | 75 | 220 | 49 | 0.92 |
| Comparative Example 2 | 3,3'-diamino-4,4'-dihydroxydiphenyl-ether (1.00) | Isophthalic acid (0.20) Diphenylether-4,4'-dicarboxylic acid (0.70) | Q-2 15 | 2 | Could not be obtained the pattern | 78 | 1.35 |
| Comparative Example 3 | 2,2-bis(3-amino-4-hydroxyphenyl) propane (1.00) | Diphenylether-4,4'-dicarboxylic acid (0.88) | Q-2 15 | 19 | 380 | 83 | 1.19 |
| Comparative Example 4 | 2,2-bis(3-amino-4-hydroxyphenyl) propane (1.00) | Diphenylether-4,4'-dicarboxylic acid (0.72) 4,4'-oxydiphathalic anhydride (0.18) | Q-2 15 | 20 | 410 | 80 | 1.30 |
| Comparative Example 5 | 4,4'-diaminodiphenylmethane (1.00) | 4,4'-oxydiphathalic anhydride (0.94) | Q-1 25 | 59 | Could not be obtained the pattern | 86 | 1.27 |

As shown in Table 2, the photosensitive resin compositions of Examples 8 to 16 have high transparency and high sensitivity, and exhibit a high cyclization rate even when cured at a low temperature of 250° C.

Semiconductor devices can be produced by applying the positive-type photosensitive resin compositions obtained in the above Examples and Comparative Examples to semiconductor elements to form a pattern and forming protective films by curing the coatings in an oven in the same manner as in Example 8.

The semiconductor devices obtained in this manner are expected to operate normally. The semiconductor devices produced by using the positive-type photosensitive resin compositions of Examples 8 to 16 are expected to operate with higher reliability than those produced by using the positive-type photosensitive resin compositions of the Comparative Examples because of their lower water absorption.

Example 17

Synthesis of Polyamide Resin

A four-necked separable flask equipped with a thermometer, a stirrer, a raw material inlet port, and a dry nitrogen gas feed pipe was charged with 286.37 g (1.000 mol) of 4,4'-methylenebis(2-amino-3,6-dimethylphenol) and 2790 g of N-methyl-2-pyrrolidone to obtain a solution. 53.36 g (0.172 mol) of 4,4'-oxydiphthalic anhydride was slowly added while cooling the flask with water. After reacting for two hours at 60° C. on an oil bath, 338.81 g (0.688 mol) of a dicarboxylic acid derivative (active ester) obtained by reacting 0.688 mol of diphenyl ether 4,4'-dicarboxylic acid and 1.376 mol of 1-hydroxy-1,2,3-benzotriazole was added, and the reaction was continued for a further 14 hours at 60° C.

Next, 48.20 g (0.280 mol) of 4-ethynylphthalic anhydride dissolved in 190 g of N-methyl-2-pyrrolidone was added and the mixture was stirred for a further three hours to complete the reaction. The reaction mixture was filtered and poured into a 3:1 (volume ratio) mixture of water and methanol. The resulting precipitate collected by filtration was sufficiently washed with water and dried under vacuum to obtain the target polyamide resin (A-20) in which the units of the formulas (13-1), (13-2), and (13-3) are randomly copolymerized at a ratio satisfying the equations $\{a/(a+b)\} \times 100=100$ and $\{b/(a+b)\} \times 100=0$. The carboxylic acid component of the polyamide resin (A-20) was a combination of 80 mol % of dicarboxylic acid and 20 mol % of tetracarboxylic acid. The resin had a number average molecular weight of 10,800 and consisted of the compounds shown in Table 2.

Except for the above, the positive-type photosensitive resin composition was prepared and evaluated in the same manner as in Example 8.

Example 18

Synthesis of Polyamide Resin

A four-necked separable flask equipped with a thermometer, a stirrer, a raw material inlet port, and a dry nitrogen gas feed pipe was charged with 39.65 g (0.200 mol) of 4,4'-diaminodiphenylmethane and 2320 g of N-methyl-2-pyrrolidone to obtain a solution. 139.59 g (0.450 mol) of 4,4'-oxydiphthalic anhydride was slowly added while cooling the flask with water. After reacting for two hours at 60° C. on an oil bath, 229.10 g (0.800 mol) of 4,4'-methylenebis(2-amino-3,6-dimethylphenol) was added together with 100 g of N-methyl-2-pyrrolidone, and the reaction was continued for a further one hour at 60° C.

Then, 221.61 g (0.450 mol) of a dicarboxylic acid derivative (active ester) obtained by reacting 0.450 mol of diphenyl ether-4,4'-dicarboxylic acid and 0.900 mol of 1-hydroxy-1,2,3-benzotriazole was added together with 100 g of N-methyl-2-pyrrolidone, and the reaction was continued for a further 14 hours at 60° C.

Next, 34.43 g (0.200 mol) of 4-ethynylphthalic anhydride dissolved in 140 g of N-methyl-2-pyrrolidone was added and the mixture was stirred for a further three hours to complete the reaction. The reaction mixture was filtered and poured into a 3:1 (volume ratio) mixture of water and methanol. The resulting precipitate collected by filtration was sufficiently washed with water and dried under vacuum to obtain the target polyamide resin (A-21) in which the units of the formulas (13-1), (13-2), and (13-3) are randomly copolymerized at a ratio satisfying the equations $\{a/(a+b)\} \times 100=80$ and $\{b/(a+b)\} \times 100=20$. The carboxylic acid component of the polyamide resin (A-21) was a combination of 50 mol % of dicarboxylic acid and 50 mol % of tetracarboxylic acid. The resin had a number average molecular weight of 11,800 and consisted of the compounds shown in Table 2.

A positive-type photosensitive resin composition was prepared in the same manner as in Example 8, except for changing the amount of the naphthoquinone diazido sulfonate compound of the formula (Q-1) to 25 g.

The resulting positive-type photosensitive resin composition was evaluated in the same manner as in Example 8, except that in the sensitivity evaluation the developing time was adjusted so that the film thickness difference before and after development was 1 μm.

Comparative Example 4

Synthesis of Polyamide Resin

A four-necked separable flask equipped with a thermometer, a stirrer, a raw material inlet port, and a dry nitrogen gas feed pipe was charged with 258.32 g (1.000 mol) of 2,2-bis(3-amino-4-hydroxyphenyl)propane and 2680 g of N-methyl-2-pyrrolidone to obtain a solution. 55.84 g (0.180 mol) of 4,4'-oxydiphthalic anhydride was slowly added while cooling the flask with water. After reacting for two hours at 60° C. on an oil bath, 354.57 g (0.720 mol) of a dicarboxylic acid derivative (active ester) obtained by reacting 0.720 mol of diphenyl ether-4,4'-dicarboxylic acid and 1.440 mol of 1-hydroxy-1,2,3-benzotriazole was added, and the reaction was continued for a further 14 hours at 60° C.

Next, 34.43 g (0.200 mol) of 4-ethynylphthalic anhydride dissolved in 140 g of N-methyl-2-pyrrolidone was added and the mixture was stirred for a further three hours to complete the reaction. The reaction mixture was filtered and poured into a 3:1 (volume ratio) mixture of water and methanol. The resulting precipitate collected by filtration was sufficiently washed with water and dried under vacuum to obtain the target polyamide resin (A-22) in which the units of the formulas (13-1), (13-2), and (13-3) are randomly copolymerized at a ratio satisfying the equations $\{a/(a+b)\} \times 100=0$ and $\{b/(a+b)\} \times 100=100$. The carboxylic acid component of the polyamide resin (A-22) was a combination of 20 mol % of dicarboxylic acid and 80 mol % of tetracarboxylic acid. The resin had a number average molecular weight of 11,300 and consisted of the compounds shown in Table 2.

The positive-type photosensitive resin composition was prepared in the same manner as in Example 8.

The resulting positive-type photosensitive resin composition was evaluated in the same manner as in Example 8, except that in the sensitivity evaluation the developing time was adjusted so that the film thickness difference before and after development was 1 μm.

Comparative Example 5

Synthesis of Polyamide Resin

A four-necked separable flask equipped with a thermometer, a stirrer, a raw material inlet port, and a dry nitrogen gas feed pipe was charged with 198.26 g (1.000 mol) of 4,4'-diaminodiphenylmethane and 1960 g of N-methyl-2-pyrrolidone to obtain a solution. After slowly adding 291.60 g (0.940 mol) of 4,4'-oxydiphthalic anhydride while cooling the flask with water, the mixture was reacted for 14 hours at 40° C. using an oil bath.

Next, 20.66 g (0.120 mol) of 4-ethynylphthalic anhydride dissolved in 80 g of N-methyl-2-pyrrolidone was added and the mixture was stirred for a further three hours to complete the reaction. The reaction mixture was filtered and poured into a 3:1 (volume ratio) mixture of water and methanol. The resulting precipitate collected by filtration was sufficiently washed with water and dried under vacuum to obtain the target polyamide resin (A-23) in which the units of the formulas (13-1), (13-2), and (13-3) are randomly copolymerized at a ratio satisfying the equations {a/(a+b)}×100=0 and {b/(a+b)}×100=100. 100 mol % of the carboxylic acid component of the polyamide resin (A-23) was tetracraboxylic acid. The number average molecular weight was 12,200 and the polyamide resin (A-23) consisted of the compounds shown in Table 2.

A positive-type photosensitive resin composition was prepared in the same manner as in Example 8, except for changing the amount of the naphthoquinone diazido sulfonate compound of the formula (Q-1) to 25 g.

The resulting positive-type photosensitive resin composition was evaluated in the same manner as in Example 8, except that in the sensitivity evaluation the developing time was adjusted so that the film thickness difference before and after development was 1 μm. It was found that unexposed areas immediately dissolved, failing to form a pattern.

Otherwise, the positive-type photosensitive resin composition was evaluated in the same manner as in Example 8.

INDUSTRIAL APPLICABILITY

According to the present invention, a raw material for a polyamide resin having a benzoxazole precursor structure, particularly a polybenzoxazole precursor resin having a benzoxazole precursor structure as a major component, having high transparency and high sensitivity and cured at a low temperature can be provided. Furthermore, a raw material for a polyamide resin having a benzoxazole structure, particularly a polybenzoxazole resin having a benzoxazole structure as a major component, having high transparency and high sensitivity and cured at a low temperature can be provided. According to the present invention, a raw material of a polyamide resin having an imide structure, an imide precursor structure, or an amide acid ester structure, exhibiting high sensitivity and a low water absorption rate when cured at a low temperature can be provided.

The positive-type photosensitive resin composition of the present invention has high transparency and high sensitivity and has a high cyclization rate even when cured at a low temperature. Due to these characteristics, the positive-type photosensitive resin composition can be suitably used as a surface protecting film and interlayer dielectric film of semiconductor elements and display elements. The positive-type photosensitive resin composition of the present invention has high transparency and high sensitivity and exhibits low water absorption even when cured at a low temperature. Due to these characteristics, the positive-type photosensitive resin composition can be suitably used as a surface protecting film and interlayer dielectric film of semiconductor elements and display elements.

The invention claimed is:

1. A bis(aminophenol) derivative shown by the following formula (1), the bis(aminophenol) derivative being used as a raw material for a polyamide resin for a positive-type photosensitive resin composition,

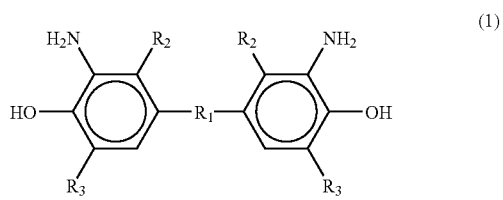

wherein $R_1$ is an organic group selected from the group consisting of an alkylene group, a substituted alkylene group, —O—, —S—, —SO$_2$—, —CO—, —NHCO—, and a single bond, $R_2$ individually represents an alkyl group, an alkoxy group, an acyloxy group, or a cycloalkyl group, and $R_3$ individually represents a hydrogen atom, an alkyl group, an alkoxy group, an acyloxy group, or a cycloalkyl group.

2. The bis(aminophenol) derivative according to claim 1, wherein $R_2$ in the formula (1) is an alkyl group and $R_3$ in the formula (1) is an alkyl group.

3. The bis(aminophenol) derivative according to claim 2, wherein $R_1$ in the formula (1) is an alkylene group or a substituted alkylene group.

4. The bis(aminophenol) derivative according to claim 1, wherein $R_1$ in the formula (1) is an alkylene group or a substituted alkylene group.

5. A process for producing a bis(aminophenol) derivative used as a raw material for a polyamide resin for a positive-type photosensitive resin composition comprising a step of reducing both nitro groups of the compound of formula (2) to obtain a bis(aminophenol) derivative,

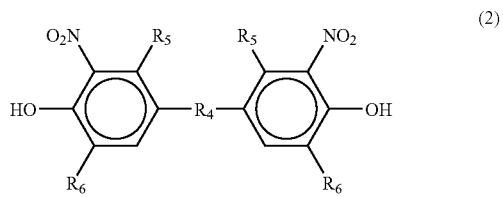

wherein $R_4$ is an organic group selected from the group consisting of an alkylene group, a substituted alkylene group, —O—, —S—, —SO$_2$—, —CO—, —NHCO—, and a single bond, $R_5$ individually represents an alkyl group, an alkoxy group, an acyloxy group, or a cycloalkyl group, and $R_6$ individually represents a hydrogen atom, an alkyl group, an alkoxy group, an acyloxy group, or a cycloalkyl group.

6. The process for producing a bis(aminophenol) derivative according to claim 5, wherein the reduction of the nitro group is carried out in a hydrogen atmosphere in the presence of a transition metal catalyst.

7. A polyamide resin obtained by a reaction of a diamine component and a carboxylic acid component, all or a part of the diamine component being a bis(aminophenol) derivative shown by the following formula (1),

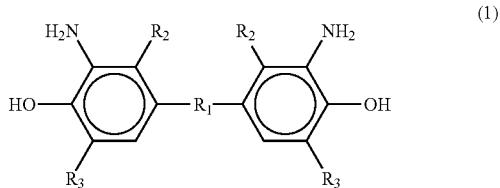

wherein $R_1$ is an organic group selected from the group consisting of an alkylene group, a substituted alkylene group, —O—, —S—, —SO$_2$—, —CO—, —NHCO—, and a single bond, $R_2$ individually represents an alkyl group, an alkoxy group, an acyloxy group, or a cycloalkyl group, and $R_3$ individually represents a hydrogen atom, an alkyl group, an alkoxy group, an acyloxy group, or a cycloalkyl group.

8. The polyamide resin according to claim 7, wherein $R_2$ in the bis(aminophenol) derivative shown by the formula (1) is an alkyl group or an alkoxy group and $R_3$ is an alkyl group or an alkoxy group.

9. The polyamide resin according to claim 7, wherein the polyamide resin contains a polybenzoxazole precursor structure.

10. A positive-type photosensitive resin composition comprising (A) the polyamide resin according to claim 7 and (B) a photosensitive diazoquinone compound.

11. The positive-type photosensitive resin composition according to claim 10, further comprising (C) a phenol compound which differs from the bis(aminophenol) derivative set forth in the general formula (1).

12. The positive-type photosensitive resin composition according to claim 11, wherein the content of (C) the phenol compound is 1 to 30 parts by weight per 100 parts by weight of (A) the polyamide resin.

13. The positive-type photosensitive resin composition according to claim 10, wherein the content of (B) the photosensitive diazoquinone compound is 1 to 50 parts by weight per 100 parts by weight of (A) the polyamide resin.

14. A protective film consisting of a cured product of the positive-type photosensitive resin composition according to claim 10.

15. The protective film according to claim 14 for protecting the surface of a semiconductor element or a display element.

16. A semiconductor device having the protective film according to claim 14.

17. A display element having the protective film according to claim 14.

18. A protective film consisting of a cured product of the positive-type photosensitive resin composition according to claim 11.

19. The protective film according to claim 18 for protecting the surface of a semiconductor element or a display element.

20. A semiconductor device having the protective film according to claim 18.

21. A display element having the protective film according to claim 18.

22. An interlayer dielectric film consisting of a cured product of the positive-type photosensitive resin composition according to claim 10.

23. A semiconductor device having the interlayer dielectric film according to claim 22.

24. A display element having the interlayer dielectric film according to claim 22.

25. An interlayer dielectric film consisting of a cured product of the positive-type photosensitive resin composition according to claim 11.

26. A semiconductor device having the interlayer dielectric film according to claim 25.

27. A display element having the interlayer dielectric film according to claim 25.

* * * * *